US012799612B2

(12) United States Patent
Choi et al.

(10) Patent No.: US 12,799,612 B2
(45) Date of Patent: Nov. 17, 2026

(54) METHOD FOR PREPARING METAL-CNT NANOCOMPOSITE, WATER-ELECTROLYSIS CATALYST ELECTRODE COMPRISING METAL-CNT NANOCOMPOSITE PREPARED BY PREPARATION METHOD, AND METHOD FOR MANUFACTURING WATER-ELECTROLYSIS CATALYST ELECTRODE

(71) Applicant: JEJU NATIONAL UNIVERSITY INDUSTRY-ACADEMIC COOPERATION FOUNDATION, Jeju-si (KR)

(72) Inventors: Soo Seok Choi, Jeju-si (KR); Jeong Hwan Oh, Jeju-si (KR); Seung Hyun Hong, Jeju-si (KR)

(73) Assignee: JEJU NATIONAL UNIVERSITY INDUSTRY-ACADEMIC COOPERATION FOUNDATION, Jeju-si (KR)

( * ) Notice: Subject to any disclaimer, the term of this patent is extended or adjusted under 35 U.S.C. 154(b) by 1 day.

(21) Appl. No.: 18/700,820

(22) PCT Filed: Oct. 11, 2022

(86) PCT No.: PCT/KR2022/015246

§ 371 (c)(1),
(2) Date: Apr. 12, 2024

(87) PCT Pub. No.: WO2023/063672

PCT Pub. Date: Apr. 20, 2023

(65) Prior Publication Data

US 2024/0426007 A1 Dec. 26, 2024

(30) Foreign Application Priority Data

Oct. 14, 2021 (KR) ........................ 10-2021-0136848

(51) Int. Cl.
*C25B 11/091* (2021.01)
*B01J 21/18* (2006.01)
(Continued)

(52) U.S. Cl.
CPC ............ *C25B 11/091* (2021.01); *B01J 21/18* (2013.01); *C23C 14/18* (2013.01); *C25B 11/052* (2021.01);
(Continued)

(58) Field of Classification Search
CPC ... C04B 35/48; C04B 35/6365; C25B 11/091; H01J 19/80
See application file for complete search history.

(56) References Cited

U.S. PATENT DOCUMENTS

2003/0211030 A1 11/2003 Olivier et al.
2006/0213326 A1* 9/2006 Gollob ................ C04B 35/6365 427/446

FOREIGN PATENT DOCUMENTS

KR 1020050091705 9/2005
KR 1020050108699 11/2005
(Continued)

OTHER PUBLICATIONS

Cozzarini et al., Metal decorated carbon nanotubes for electrocatalytic water splitting, International Journal of Hydrogen Energy, 42, 2017, pp. 18763-18773 (Year: 2017).*
(Continued)

*Primary Examiner* — Dah-Wei D. Yuan
*Assistant Examiner* — Andrew J Bowman
(74) *Attorney, Agent, or Firm* — LEX IP MEISTER, PLLC

(57) ABSTRACT

The present disclosure relates to a method for preparing a metal-CNT nanocomposite, a water-electrolysis catalyst electrode comprising metal-CNT nanocomposite prepared
(Continued)

by preparation method, and a method for manufacturing a water-electrolysis catalyst electrode. Specifically, the present disclosure can provide a method for preparing a metal-CNT (carbon nanotube) nanocomposite that does not use conventional wet methods and can be used as a water-electrolysis catalyst or as an electrode material for lithium-ion batteries, and a method for preparing a water-electrolysis catalyst that includes a metal-CNT nanocomposite with excellent performance as a water-electrolysis catalyst.

3 Claims, 24 Drawing Sheets

(51) Int. Cl.
*C23C 14/18* (2006.01)
*C25B 11/052* (2021.01)
*C25B 11/065* (2021.01)

(52) U.S. Cl.
CPC ......... *C25B 11/065* (2021.01); *B01J 2235/15* (2024.01); *B01J 2235/30* (2024.01)

(56) References Cited

FOREIGN PATENT DOCUMENTS

| | | |
|---|---|---|
| KR | 10-2006-0116285 | 11/2006 |
| KR | 1020060116285 X | 11/2006 |
| KR | 1020100126344 | 12/2010 |

OTHER PUBLICATIONS

Kang et al., Role of spray processes on microstructural evolution and physical and mechanical properties of multi-walled carbon nanotube reinforced cu composite coatings, Applied Surface Science, 356, 2015, pp. 1039-1051 (Year: 2015).*

Hong et al., Thermal plasma synthesis of Si-MWCNT nano composite and its electrochemical performance as an anode for lithium ion batteries, Jeju National University, Nov. 30, 2020, pp. 1-45 (Year: 2020).*

Seung-Hyun Hong, "Thermal plasma synthesis of Si-MWCNT nano composite and its electrochemical performance as an anode for lithium-ion batteries", A thesis for the degree of Master of Engineering, Jeju National University, Nov. 30, 2020.

Jeong-Hwan Oh, "Thermal Plasma Synthesis of Nano-catalyst and Analysis of Electrochemical Performance for Water Splitting", A dissertation for the degree of Doctor of Philosophy, Jeju National University, Aug. 2021.

Oh, Jeong-Hwan. "Thermal Plasma Synthesis of Nano-catalyst and Analysis of Electrochemical Performance for Water Splitting." Doctoral Dissertation in the Department of Energy and Chemical Engineering in Jeju National University (Aug. 2021): 1-138.

Hong, Seung-Hyun. "Thermal plasma synthesis of Si-MWCNT nano composite and its electrochemical performance as an anode for lithium-ion batteries." A thesis submitted in partial fulfillment of the requirement for the degree of Master of Engineering in the Department of Nuclear & Energy Engineering in Jeju National University (Nov. 30, 2020): 1-44.

* cited by examiner

METHOD FOR PREPARING METAL-CNT NANOCOMPOSITE, WATER-ELECTROLYSIS CATALYST ELECTRODE COMPRISING METAL-CNT NANOCOMPOSITE PREPARED BY PREPARATION METHOD, AND METHOD FOR MANUFACTURING WATER-ELECTROLYSIS CATALYST ELECTRODE

CROSS-REFERENCE TO RELATED APPLICATION(S)

This application claims the benefit of priority to Korean Patent Application No. 10-2021-0136848, filed on Oct. 14, 2021, the contents of the patent application are incorporated herein by reference in their entirety.

TECHNICAL FIELD

The present disclosure relates to a method for preparing a metal-CNT nanocomposite, a water-electrolysis catalyst electrode comprising metal-CNT nanocomposite prepared by preparation method, and a method for manufacturing a water-electrolysis catalyst electrode.

BACKGROUND ART

When electrical energy is applied to water molecules, hydrogen and oxygen molecules are produced, and the overall reaction thereof consists of two reactions: the Hydrogen Evolution Reaction (HER) and the Oxygen Evolution Reaction (OER).

Water-electrolysis theoretically occurs at 1.23 V, but a higher overpotential is actually required to produce hydrogen and oxygen. The higher the overpotential, the more hydrogen and oxygen can be produced, but this also leads to an increase in the cost of electrical energy.

In order to reduce the cost of electrical energy, it is necessary to lower the overpotential supplied to the reaction, which inevitably involves the use of electrode catalysts. However, the synthesis methods for electrode catalysts mainly involve wet chemistry processes, which are characterized by long synthesis times and high catalyst costs, thereby increasing the cost of hydrogen production.

Therefore, there is a need for electrode catalyst manufacturing technology that can solve the above problem.

PRIOR ART DOCUMENT

Patent Documents

1. Korean Patent Registration No. 10-1733492 (Apr. 28, 2017)

DISCLOSURE OF THE INVENTION

Technical Problem

Embodiments of the present disclosure provide a method for preparing a metal-CNT (carbon nanotube) nanocomposite that does not use conventional wet methods and can be used as a water-electrolysis catalyst or as an electrode material for lithium-ion batteries. Additionally, embodiments of the present disclosure provide a water-electrolysis catalyst electrode that includes a metal-CNT nanocomposite with excellent performance as a water-electrolysis catalyst, and a method for manufacturing the same.

Technical Solution

According to an aspect of the present disclosure, an example embodiment provides a method for preparing a metal-CNT nanocomposite. The method includes generating a plasma jet by injecting plasma forming gas into a triple torch-type plasma jet device and applying input power; depositing vaporized metal on CNT by feeding the metal and the CNT to the plasma jet respectively, using carrier gas; and recovering the metal-CNT nanocomposite by cooling the metal-deposited CNT.

A molar ratio of the metal and the CNT may be 1:1 to 3:1.

The metal may be copper or nickel.

The CNT may have a diameter of 1 to 30 nm and a length of 20 μm or less.

The metal may be fed with argon gas which has a flow rate of 3 to 8 L/min, and the CNT may be fed with argon gas which has a flow rate of 5 to 55 L/min.

The metal-CNT nanocomposite may be in a form in which the metal is deposited on a surface of the CNT.

According to another aspect of the present disclosure, an example embodiment provides a metal-CNT nanocomposite prepared by the aforementioned method.

According to another aspect of the present disclosure, an example embodiment provides a method for manufacturing a water-electrolysis catalyst electrode including a metal-CNT nanocomposite, comprising preparing the metal-CNT nanocomposite by the aforementioned method and coating the water-electrolysis catalyst electrode with the metal-CNT nanocomposite.

The coating the water-electrolysis catalyst electrode with the metal-CNT nanocomposite may comprise manufacturing a catalyst ink that includes the metal-CNT nanocomposite; and coating the electrode with the catalyst.

The manufacturing the catalyst ink may comprise preparing a mixture by combining the metal-CNT nanocomposite, propanol, deionized water, and Nafion; and ultrasonically treating the mixture for 50 to 70 minutes.

An amount of the metal-CNT nanocomposite coated on the electrode may be 1 to 1.5 mg per $cm^2$ of a surface of the electrode.

According to another aspect of the present disclosure, an example embodiment provides a water-electrolysis catalyst electrode including a metal-CNT nanocomposite that is prepared by the above method.

Advantageous Effects

The present disclosure can prepare a metal-CNT nanocomposite capable of utilizing as a water-electrolysis catalyst or electrode material for lithium-ion batteries by using thermal plasma, and manufacture a water-electrolysis catalyst electrode including this nanocomposite. By doing so, without employing wet chemistry methods, the present disclosure can exhibit excellent Oxygen Evolution Reaction (OER) and Hydrogen Evolution Reaction (HER) at the anode or cathode due to superior overpotentials, current densities, and surface areas.

BEST MODE FOR CARRYING OUT THE INVENTION

Hereinafter, the preferred example embodiments of the present disclosure are described in detail. In describing the present disclosure, a detailed description of prior arts related to the present disclosure will be omitted if it is deemed that such description may obscure the essence of the present disclosure. Throughout the specification, when a part is said to "include" a certain component, it means that it does not exclude other components but can further include other components, unless specifically stated to the contrary.

Before describing the present disclosure in detail, an explanation will be given about a triple torch-type plasma device used in the present disclosure.

Figure 1:
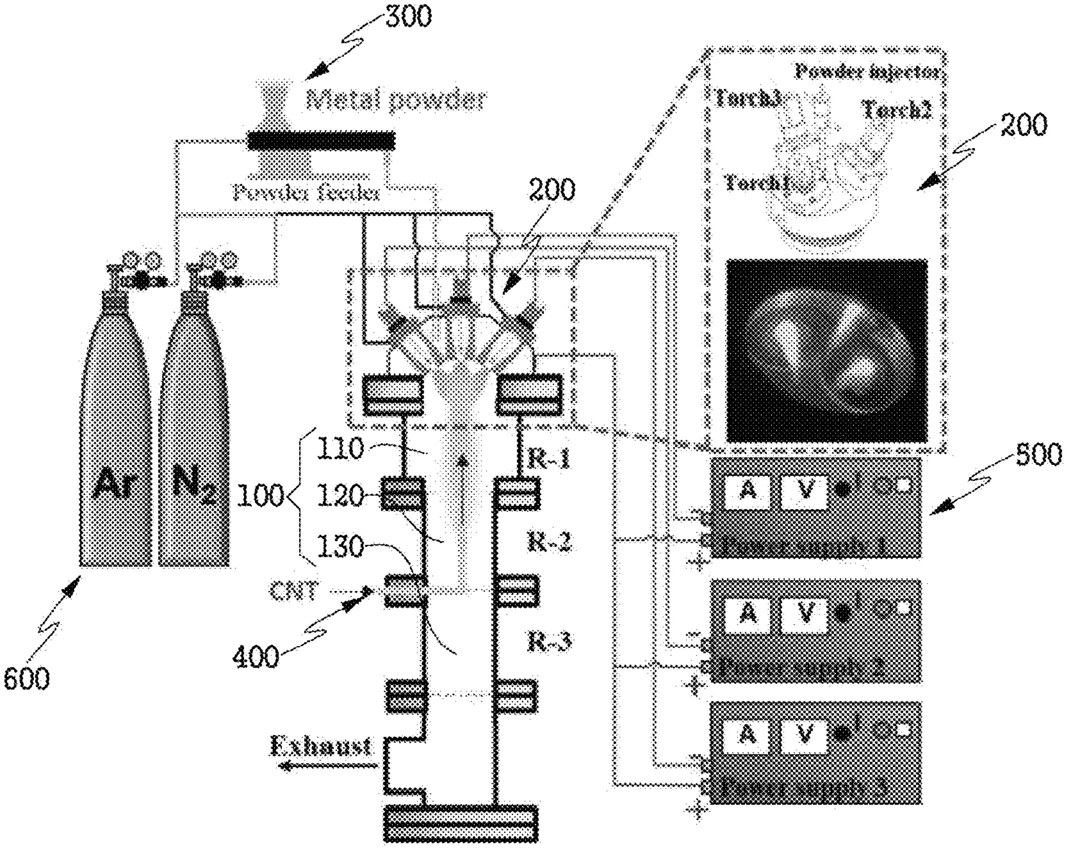
FIG. 1 is a diagram illustrating a triple torch-type plasma jet device according to the present disclosure.

FIG. 1 is a diagram illustrating a triple torch-type plasma jet device according to the present disclosure.

Referring to FIG. 1, a triple torch-type plasma jet device may include a reaction chamber 100 that provides a space where plasma jet is formed and where raw material react; a torch unit 200 provided on one side of the reaction chamber 100 to supply a heat source to initial material; a metal supply unit 300 connected to the top of the reaction chamber 100 and supplying metal raw material inside the reaction chamber 100 through a line; a CNT supply unit 400 connected to the center of the reaction chamber 100 and supplying CNT raw material inside the reaction chamber 100 through a line; a power supply device 500 electrically connected to the torch unit 200 and supplying input power; and a gas supply device 600 connected to the torch unit 200, the metal supply unit 300, and the CNT supply unit 400, and supplying gas. The torch unit 200 may include a plurality of torches arranged at even intervals, and a plurality of plasma jets generated from the torch units 200 are arranged to be merged.

Additionally, the metal is supplied in the same direction as the plasma jet of the torch unit 200, and the CNT is supplied in the opposite direction to the plasma jet at the center of the reaction chamber 100.

The CNT (carbon nanotube) is added along with a large amount of carrier gas. When the CNT is mixed and supplied together with the metal, in some cases, the CNT may be sublimated due to the high temperature of the plasma jet and cannot exist in the form of CNT. Therefore, it is preferable that the CNT is supplied separately from the metal, as described above, and added with a large amount of carrier gas.

The reaction chamber 100 may be a space where raw material react by the plasma jet and prepared material is accumulated, and include a first reactor 110, a second reactor 120, and a third reactor 130, each equipped with a quenching system on one side.

The torch unit 200 may be equipped with three torches, which can be arranged at even intervals.

In the present disclosure, a triple torch-type plasma jet is preferably generated by a non-transferred method.

In the present disclosure, a triple torch-type plasma jet device may generate a direct current arc discharge between a cathode made of a tungsten rod and an anode on the inner surface of a copper nozzle, send plasma forming gas from the rear in a swirling flow, which allow plasma forming gas to be heated by the arc, and prepare metal-CNT nanocomposite by generating a non-transferred plasma jet in which intense plasma jet streams are ejected from the anode nozzle.

The plasma jet is an ionized gas consisting of electrons, ions, atoms, and molecules generated in the torch unit using direct current arc or high-frequency inductive coupling discharge, and is a high-speed jet with an ultrahigh temperature ranging from thousands to tens of thousands of Kelvin (K) and high activity.

Hereinafter, as an example embodiment according to the present disclosure, a method for preparing a metal-CNT nanocomposite will be described in detail.

Figure 2:
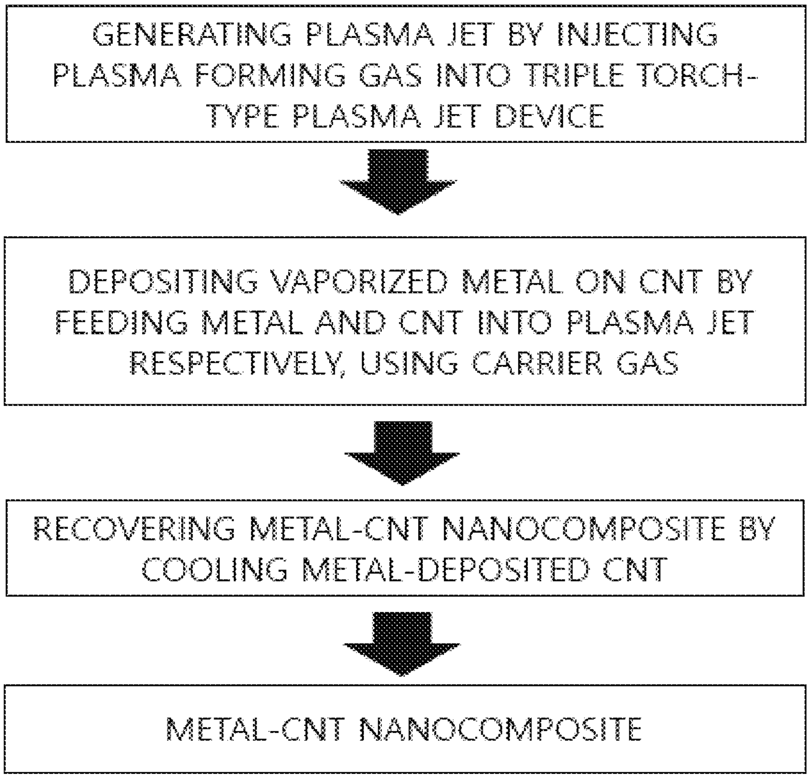
FIG. 2 is a flowchart illustrating a method for preparing a metal-CNT nanocomposite according to the present disclosure.

As illustrated in FIG. 2, the metal-CNT nanocomposite according to the present disclosure may be prepared through the following operations: generating a plasma jet by injecting plasma forming gas into a triple torch-type plasma jet device and applying input power; depositing vaporized metal on CNT by adding the metal and the CNT into the plasma jet respectively, using carrier gas; and recovering the metal-CNT nanocomposite by cooling the metal-deposited CNT.

The generating the plasma jet by injecting the plasma forming gas into the triple torch-type plasma jet device and applying input power may be processed by mixing argon (Ar) and nitrogen (N2) and injecting them at a flow rate of 8 to 16 L/min into the triple torch-type plasma jet device, and adjusting input power of plasma to 18 to 25 kW. In this case, argon and nitrogen may be mixed at flow rates of 2 to 6 L/min and 6 to 10 L/min, respectively.

The depositing the vaporized metal on the CNT by adding the metal and the CNT into the plasma jet respectively, using the carrier gas is performed as follows:

First, the metal raw material and the CNT are added respectively with the carrier gas. At this time, the metal raw material and the CNT may be added in opposite directions, and the carrier gas may be argon gas.

The flow rate of argon gas injected with the metal raw material may be 2 to 7 L/min and a feed rate of the metal raw material may be 0.5 to 0.7 g/min. Additionally, the preferred flow rate of argon gas injected with the CNT raw material may be 5 to 55 L/min, more preferably 25 to 30 L/min. A feed rate of the CNT raw material fed may be 0.05 to 0.07 g/min.

Since the most excellent efficiency for water-electrolysis catalysts is achieved within ranges of the feed rates of the metal and the CNT and the flow rates of the argon gas, the above ranges are preferable.

Furthermore, when the flow rate of argon gas injected with the CNT is less than 5 L/min or exceeds 55 L/min, the metal may not deposit on the CNT surface, and instead, conventional nano-sized metal particles may be synthesized.

The added metal raw material is vaporized by the plasma jet and deposited on the surface of the CNT, forming the metal-CNT nanocomposite. The CNT is added separately from the metal, and thus is not vaporized, allowing the metal to be deposited on the surface of the CNT.

The first to third reactors 110, 120, and 130 may be further provided with a cooling system to cool the metal-deposited CNT. The cooling may be natural cooling, and the metal-CNT nanocomposite is prepared as the metal-deposited CNT cool down.

The molar ratio of the fed metal and CNT may be 1:1 to 3:1, preferably 2:1. The metal-CNT nanocomposite may be easily formed within the above range.

The metal may be copper or nickel powder with a diameter of 0.5 to 2 μm, preferably nickel powder.

The metal-CNT nanocomposite prepared through the aforementioned operations may be prepared in a short time via a single step, thereby increasing energy efficiency, and the metal-CNT nanocomposite may be in the form of the metal being deposited on the surface of the CNT.

Another example embodiment according to the present disclosure relates to metal-CNT nanocomposite prepared by the aforementioned method.

The metal-CNT nanocomposite may be used in various fields, preferably as cathode material for lithium-ion batteries or as water-electrolysis catalysts.

Another example embodiment according to the present disclosure relates to a method for manufacturing a water-electrolysis catalyst electrode that includes the metal-CNT nanocomposite prepared by the aforementioned method.

Figure 3:
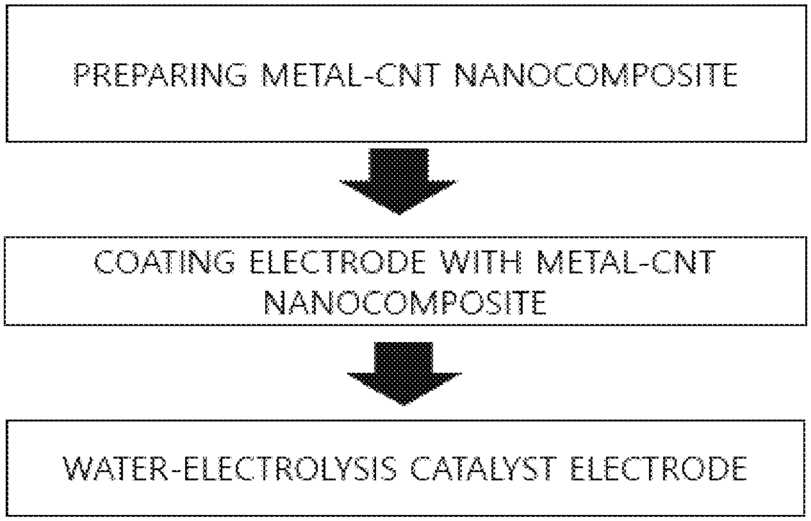
FIG. 3 is a flowchart illustrating a method for manufacturing a water-electrolysis catalyst electrode according to the present disclosure.

As illustrated in FIG. 3, the water-electrolysis catalyst electrode according to the present disclosure may be manufactured by following operations: preparing the metal-CNT nanocomposite using the aforementioned method; and coating the water-electrolysis catalyst electrode with the metal-CNT nanocomposite.

Since the method for preparing the metal-CNT nanocomposite is the same as previously described, a detailed description thereof will be omitted.

Another example embodiment according to the present disclosure relates to a method for manufacturing catalyst ink that includes the metal-CNT nanocomposite prepared by the aforementioned method.

Figure 4:
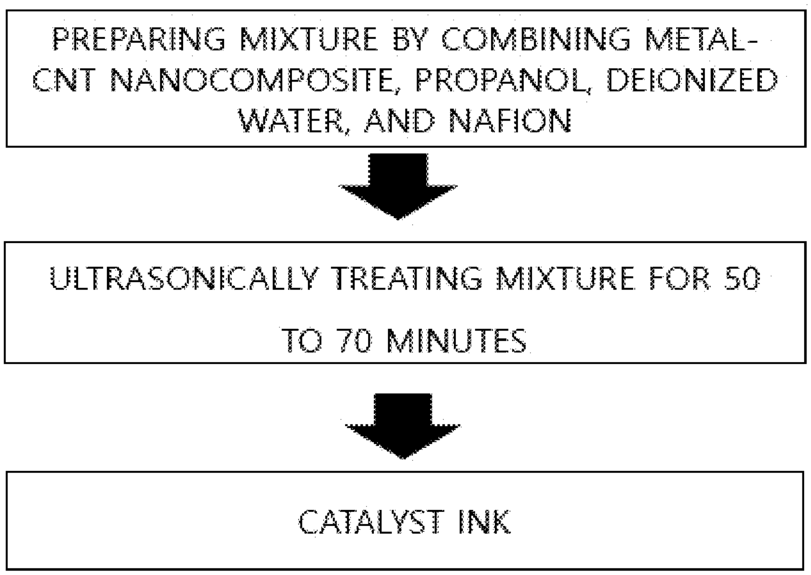
FIG. 4 is a flowchart illustrating operations for manufacturing a catalyst ink according to the present disclosure.

As illustrated in FIG. 4, the manufacturing the catalyst ink that includes the metal-CNT nanocomposite may include: preparing a mixture by combining the metal-CNT nanocomposite, propanol, deionized water, and Nafion; and ultrasonically treating the mixture for 50 to 70 minutes.

The mixture may be prepared by mixing 40 to 60 mg of the metal-CNT nanocomposite, 600 to 800 μl of propanol, 200 to 400 μl of deionized water, and 5 to 20 μl of Nafion (5 wt %).

When the ultrasonic treatment time deviates from the above range, the manufacturing efficiency of the catalyst ink decreases, so the above range is preferable.

The catalyst ink may be coated on the electrode by applying the ultrasonically treated catalyst ink to the electrode and then drying the applied catalyst ink. Specifically, 2 to 5 μl of the ultrasonically treated catalyst ink may be applied to the electrode using a pipette, and dried at room temperature for 40 to 50 minutes.

The electrode may be a glassy carbon electrode, and the amount of the metal-CNT nanocomposite coated on the electrode may be 1 to 1.5 mg per $cm^2$ of the electrode surface, preferably 1.2 mg per $cm^2$ of the electrode surface.

When the amount of the metal-CNT nanocomposite coated on the electrode surface is outside the above-mentioned range, there may be issues such as cracking and poor coating of the applied ink after being dried, so the above-mentioned range is preferable.

As an example embodiment according to the present disclosure, the present disclosure provides a water-electrolysis catalyst electrode that includes the metal-CNT nanocomposite prepared by the aforementioned method.

The water-electrolysis catalyst electrode according to the present disclosure may generate hydrogen and oxygen at the cathode or the anode, respectively, and specifically, may exhibit excellent hydrogen or oxygen evolution reactions at the cathode or the anode in an alkaline electrolyte (1 M KOH).

Hereinafter, the present disclosure is described in more detail by the following example embodiments and experimental examples.

Preparation Examples 1 to 3: Nickel-CNT Nanocomposite

Plasma forming gas was supplied to the torch unit of the triple torch-type plasma jet device illustrated in FIG. 1, and a plasma jet was generated under the operating conditions listed in Table 1.

Next, nickel and CNT were separately supplied to the triple torch-type plasma jet device, and the supplied nickel was vaporized and deposited on the surface of the CNT.

Subsequently, the nickel-CNT nanocomposite was prepared with nickel deposited on the surface of the CNT by cooling the nickel-deposited CNT.

Here, nickel (1 μm, purity 99.8%, Sigma Aldrich, USA) and the CNT (diameter: 5~20 nm, length: less than 10 μm, Carbon Nano-material Technology, Korea) commercially available were used, and the operating time was 10 minutes.

TABLE 1

| Classification | Preparation Example 1 (EXP 1) | Preparation Example 2 (EXP 2) | Preparation Example 3 (EXP 3) |
|---|---|---|---|
| Molar Ratio of Ni/CNT (mol %) | 2:01 | 2:01 | 2:01 |
| Flow Rate of Carrier Gas for Ni (L/min) | 5 Ar | 5 Ar | 5 Ar |
| Flow Rate of Carrier Gas for CNT (L/min) | 10 Ar | 27 Ar | 50 Ar |
| Feeding Rate (g/min) | Ni: 0.6 CNT: 0.062 | Ni: 0.6 CNT: 0.062 | Ni: 0.6 CNT: 0.062 |
| Flow Rate of Plasma Forming Gas (L/min) | 4 Ar 8 $N_2$ | 4 Ar 8 $N_2$ | 4 Ar 8 $N_2$ |
| Plasma Input Power (kW) | 21 | 21 | 21 |
| Reactor Pressure (kPa) | 101.3 | 101.3 | 101.3 |

Preparation Examples 4 to 6: Copper-CNT Nanocomposite

Plasma forming gas was supplied to the torch unit of the triple torch-type plasma jet device illustrated in FIG. 1, and a plasma jet was generated under the operating conditions listed in Table 2.

Next, copper and CNT were separately supplied to the triple torch-type plasma jet device, and copper was vaporized and deposited on the surface of the CNT.

Subsequently, copper-CNT nanocomposite was prepared with copper deposited on the surface of the CNT by cooling the copper-deposited CNT.

Here, copper (1 μm, purity 99.8%, Sigma Aldrich, USA) and the CNT (diameter: 5~20 nm, length: less than 10 μm, Carbon Nano-material Technology, Korea) commercially available were used, and the operating time was 10 minutes.

TABLE 2

| Classification | Preparation Example 4 (EXP 4) | Preparation Example 5 (EXP 5) | Preparation Example 6 (EXP 6) |
|---|---|---|---|
| Molar Ratio of Ni/CNT (mol %) | 2:01 | 2:01 | 2:01 |
| Flow Rate of Carrier Gas for Ni (L/min) | 5 Ar | 5 Ar | 5 Ar |
| Flow Rate of Carrier Gas for CNT (L/min) | 10 Ar | 27 Ar | 50 Ar |
| Feeding Rate (g/min) | Cu: 0.61 CNT: 0.057 | Cu: 0.61 CNT: 0.057 | Cu: 0.61 CNT: 0.057 |
| Flow Rate of Plasma Forming Gas (L/min) | 4 Ar 8 $N_2$ | 4 Ar 8 $N_2$ | 4 Ar 8 $N_2$ |

TABLE 2-continued

| Classification | Preparation Example 4 (EXP 4) | Preparation Example 5 (EXP 5) | Preparation Example 6 (EXP 6) |
|---|---|---|---|
| Plasma Input Power (kW) | 21 | 21 | 21 |
| Reactor Pressure (kPa) | 101.3 | 101.3 | 101.3 |

Example 1

50 mg of the nickel-CNT nanocomposite prepared in Preparation Example 1, 700 μl of propanol, 300 μl of deionized water, and 10 μl of Nafion (5 wt %) were mixed and ultrasonically treated for 60 minutes to prepare catalyst ink.

The prepared catalyst ink was loaded (coated) onto a pre-cleaned glassy carbon electrode at 1.2 mg per $cm^2$ using a pipette, and then dried in air for 50 minutes to manufacture catalyst electrode.

Example 2

50 mg of the nickel-CNT nanocomposite prepared in Preparation Example 2, 700 μl of propanol, 300 μl of deionized water, and 10 μl of Nafion (5 wt %) were mixed and ultrasonically treated for 60 minutes to prepare catalyst ink.

The prepared catalyst ink was loaded (coated) onto a pre-cleaned glassy carbon electrode at 1.2 mg per $cm^2$ using a pipette, and then dried in air for 50 minutes to manufacture catalyst electrode.

Example 3

50 mg of the nickel-CNT nanocomposite prepared in Preparation Example 4, 700 μl of propanol, 300 μl of deionized water, and 10 μl of Nafion (5 wt %) were mixed and ultrasonically treated for 60 minutes to prepare catalyst ink.

The prepared catalyst ink was loaded (coated) onto a pre-cleaned glassy carbon electrode at 1.2 mg per $cm^2$ using a pipette, and then dried in air for 50 minutes to manufacture catalyst electrode.

Example 4

50 mg of the nickel-CNT nanocomposite prepared in Preparation Example 5, 700 μl of propanol, 300 μl of deionized water, and 10 μl of Nafion (5 wt %) were mixed and ultrasonically treated for 60 minutes to prepare catalyst ink.

The prepared catalyst ink was loaded (coated) onto a pre-cleaned glassy carbon electrode at 1.2 mg per $cm^2$ using a pipette, and then dried in air for 50 minutes to manufacture catalyst electrode.

Experimental Example 1

The crystalline structure of the nickel-CNT nanocomposite prepared in Preparation Examples 1 to 3 was analyzed using X-ray diffraction or FE-SEM. The results are illustrated in FIGS. 5 to 7.

Figure 5:
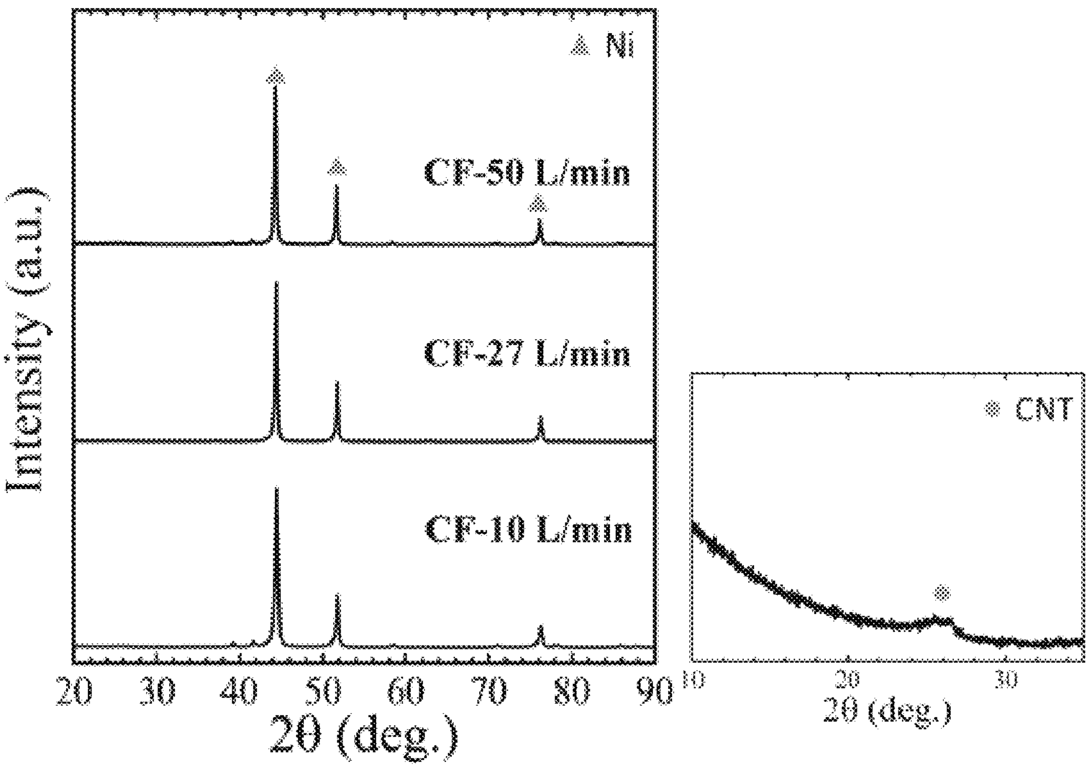
FIG. 5 is an XRD graph of a nickel-CNT nanocomposite prepared in Preparation Examples 1 to 3 and recovered from the first reactor.
Figure 6:
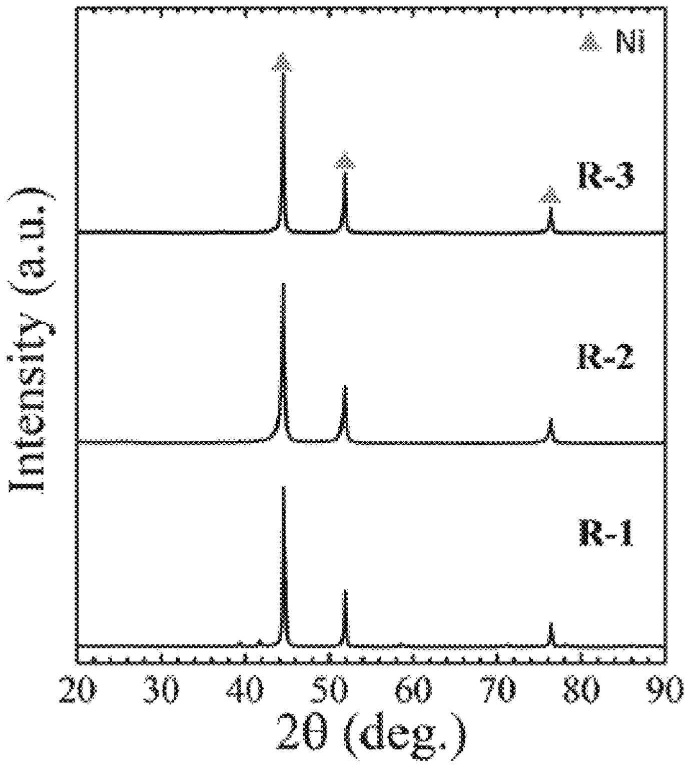
FIG. 6 is an XRD graph of a nickel-CNT nanocomposite prepared in Preparation Example 2 and recovered from the first to the third reactor.
Figure 7:
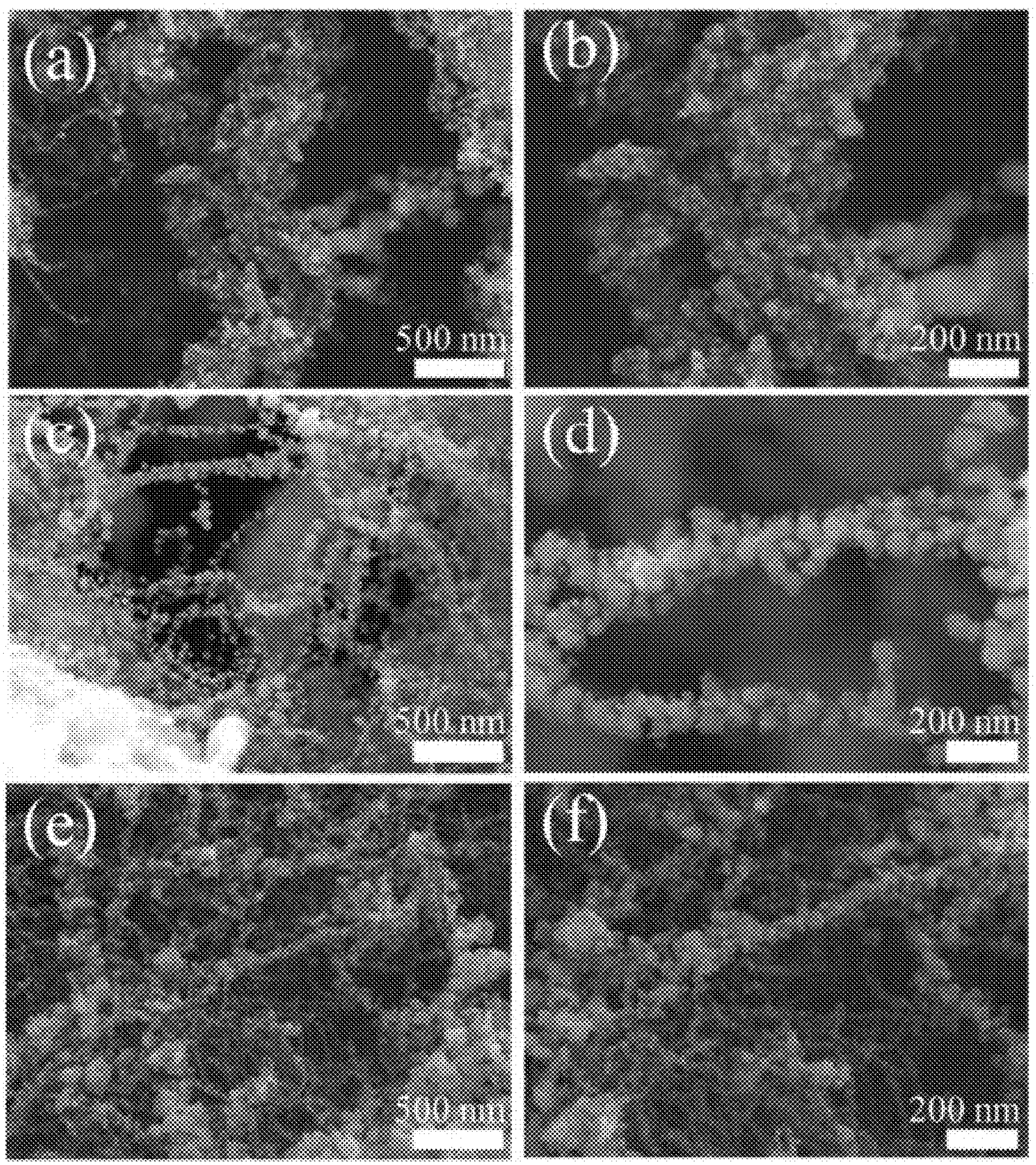
FIG. 7 is a graph illustrating FE-SEM results of a nickel-CNT nanocomposite prepared in Preparation Examples 1 to 3 and recovered from the first reactor.

FIG. 5 illustrates an XRD graph of the nickel-CNT nanocomposite prepared in Preparation Examples 1 to 3 and recovered from the first reactor, FIG. 6 illustrates an XRD graph of the nickel-CNT nanocomposite prepared in Preparation Example 2 and recovered from the first to the third reactors, and FIG. 7 illustrates FE-SEM results of the nickel-CNT nanocomposite prepared in Preparation Examples 1 to 3 and recovered from the first reactor.

Referring to FIG. 5, although there are two peaks for Ni and CNT, the peak of the CNT does not appear on the graph due to its relatively lower crystallinity compared to the Ni. Additionally, since the CNT was fed with a large amount of argon gas separately from the metal, the CNT remained structurally unchanged even when exposed to the high temperature of the plasma, and consequently, nickel carbide was not synthesized due to the absence of C to react with Ni.

Referring to FIG. 6, only Ni peaks existed depending on the collection location, and the crystallinity also showed a similar appearance.

Referring to FIG. 7, in the case of Preparation Example 1 (a, b), it can be confirmed that general spherical nanoparticles exist instead of the form of Ni-CNT nanocomposite, and these are synthesized as Ni nanoparticles. In Preparation Examples 2 (c, d) and 3 (e, f), a morphology of particles presumed to be Ni attached to the surface of CNT can be confirmed.

Experimental Example 2

Figure 8:
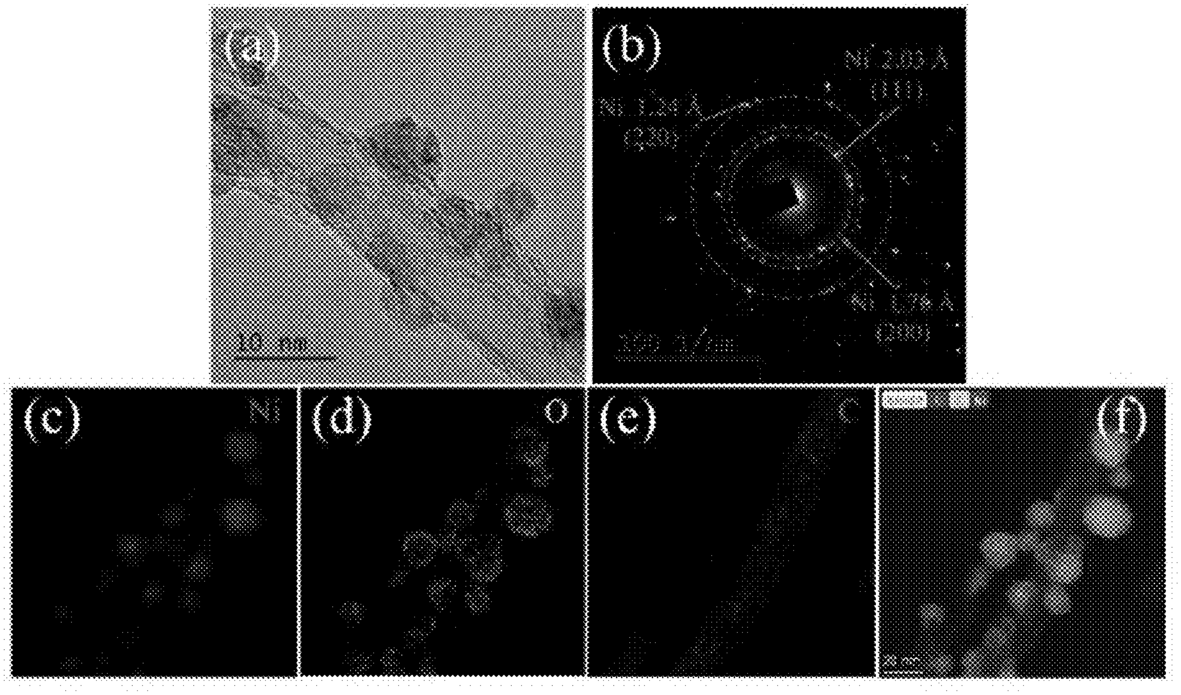
FIG. 8 illustrates analysis results of FE-TEM, SAED, and EDS for a nickel-CNT nanocomposite prepared in Preparation Example 2 and recovered from the first reactor.

The nickel-CNT nanocomposite prepared in Preparation Example 2 and recovered from the first reactor was analyzed using FE-TEM (Talos Fe200X G2 (Thermo Fisher Scientific, US)), SAED, and EDS, and the results are illustrated in FIG. 8.

FIG. 8 illustrates analysis results of FE-TEM, SAED, and EDS for the nickel-CNT nanocomposite prepared in Preparation Example 2 and recovered from the first reactor.

Referring to FIG. 8, it can be confirmed that particles are deposited on the surface of the CNT in the FE-TEM image (a), and the SAED pattern (b) shows data identical to that obtained by XRD diffraction analysis. Additionally, examining the TEM-EDS mapping analyses (c) to (f), it can be confirmed that the particles deposited on the surface of the CNT are nickel, and a thin oxide film enveloping the particles has been formed.

Experimental Example 3

The crystalline structure of the copper-CNT nanocomposite prepared in Preparation Examples 4 to 6 was analyzed using X-ray diffraction or FE-SEM. The results are illustrated in FIGS. 9 to 11.

Figure 9:
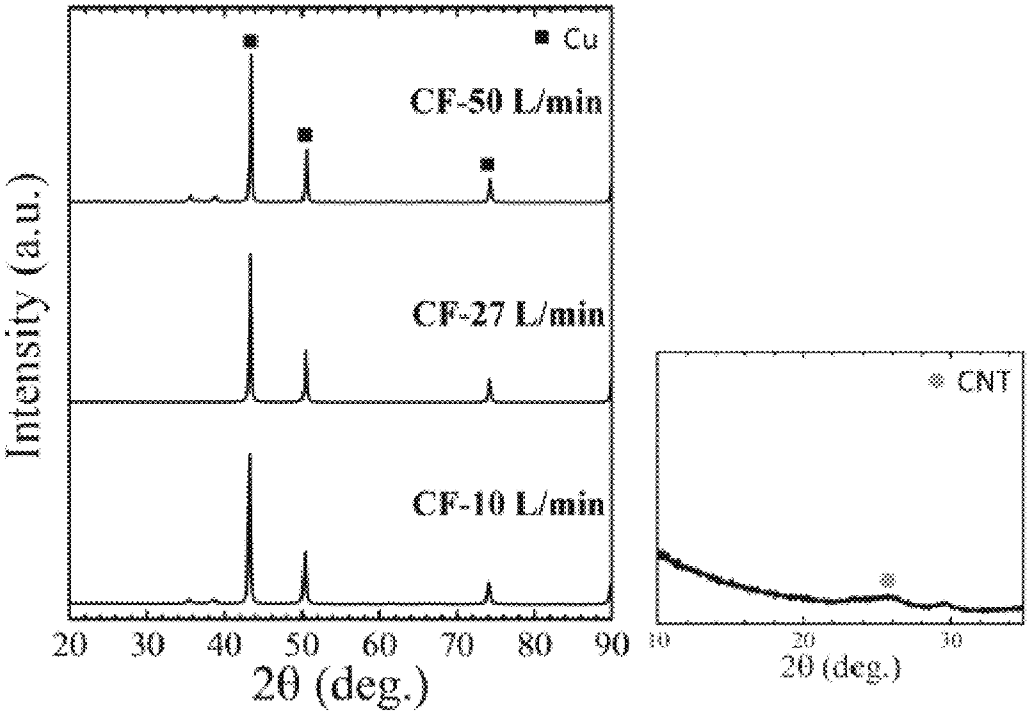
FIG. 9 illustrates the XRD graph of the copper-CNT nanocomposite prepared in Preparation Examples 4 to 6 and recovered from the first reactor.
Figure 10:
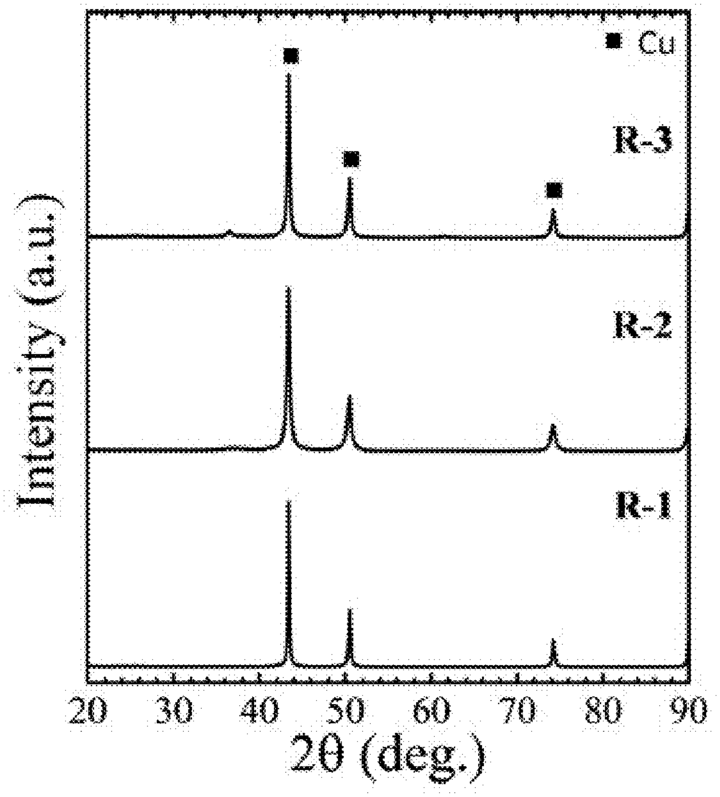
FIG. 10 illustrates the XRD graph of the copper-CNT nanocomposite prepared in Preparation Example 5 and recovered from the first to the third reactor.
Figure 11:
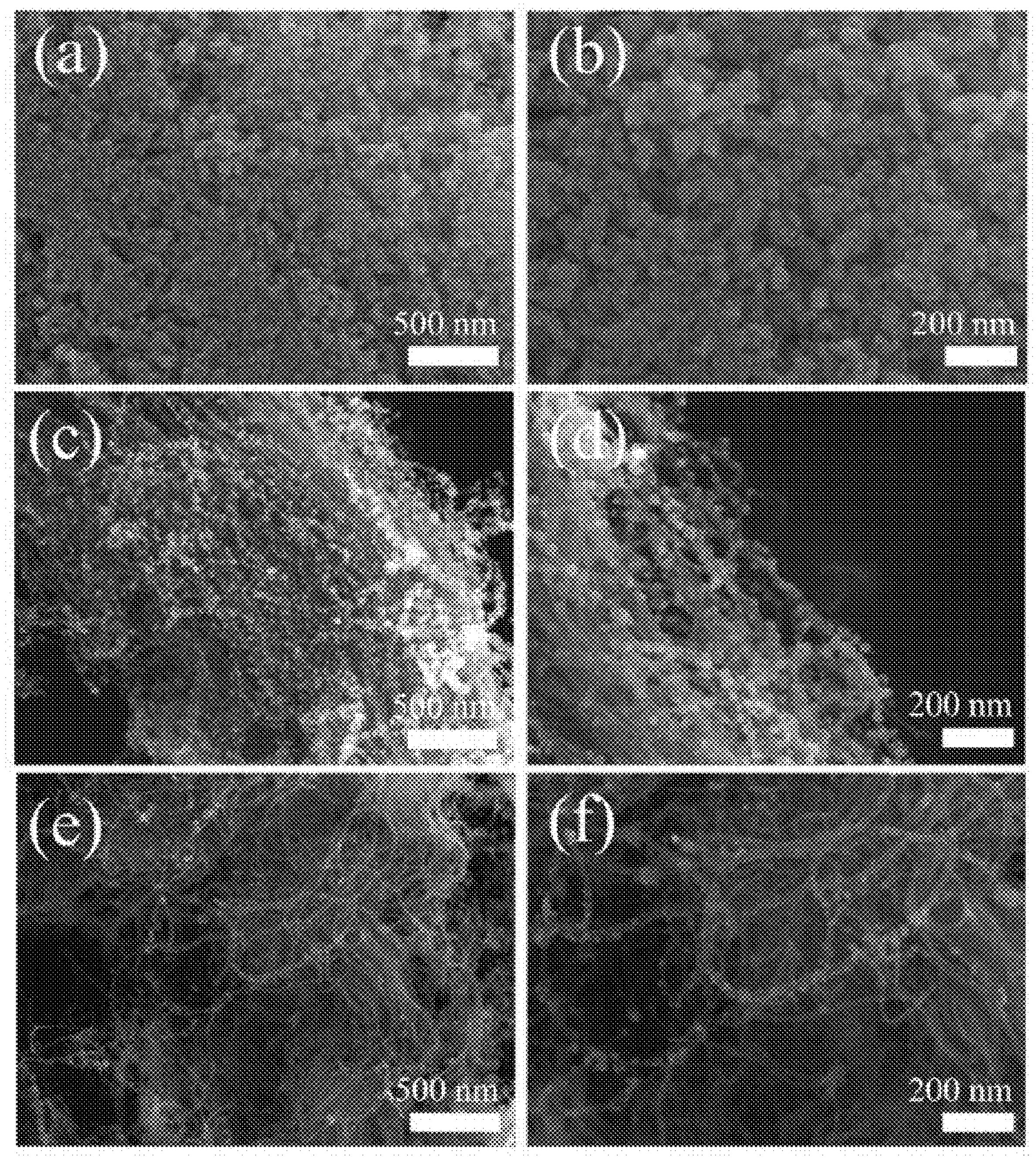
FIG. 11 is a graph illustrating FE-SEM results of a copper-CNT nanocomposite prepared in Preparation Examples 1 to 3 and recovered from the first reactor.

FIG. 9 illustrates an XRD graph of the copper-CNT nanocomposite prepared in Preparation Examples 4 to 6 and recovered from the first reactor, FIG. 10 illustrates an XRD graph of the nickel-CNT nanocomposite prepared in Preparation Example 5 and recovered from the first to the third reactors, and FIG. 11 illustrates FE-SEM results of the copper-CNT nanocomposite prepared in Preparation Examples 1 to 3 and recovered from the first reactor.

Referring to FIG. 9, although there are two peaks for Cu and CNT, the peak of the CNT does not appear on the graph due to its relatively lower crystallinity compared to the Cu. Additionally, since the CNT was fed with a large amount of argon gas separately from the metal, the CNT remained structurally unchanged even when exposed to the high temperature of the plasma, and consequently, copper carbide was not synthesized due to the absence of C to react with Cu.

Referring to FIG. 10, only Cu peaks existed depending on the collection location, and the crystallinity also showed a similar appearance.

Referring to FIG. 11, in the case of Preparation Example 4 (a, b), it can be confirmed that general spherical nanoparticles exist instead of the form of Cu-CNT nanocomposite, and these are synthesized as Cu nanoparticles. In Preparation Examples 5 (c, d) and 6 (e, f), a morphology of particles presumed to be Cu attached to the surface of CNT can be confirmed, and the particle size is relatively larger than the Ni-CNT nanocomposite.

This is due to the difference in thermal conductivity between Ni and Cu. It is believed that Cu, which has higher thermal conductivity and forms nuclei faster than Ni, resulting in longer growth time and formation of particles larger than those in Ni-CNT.

Experimental Example 4

Figure 12:
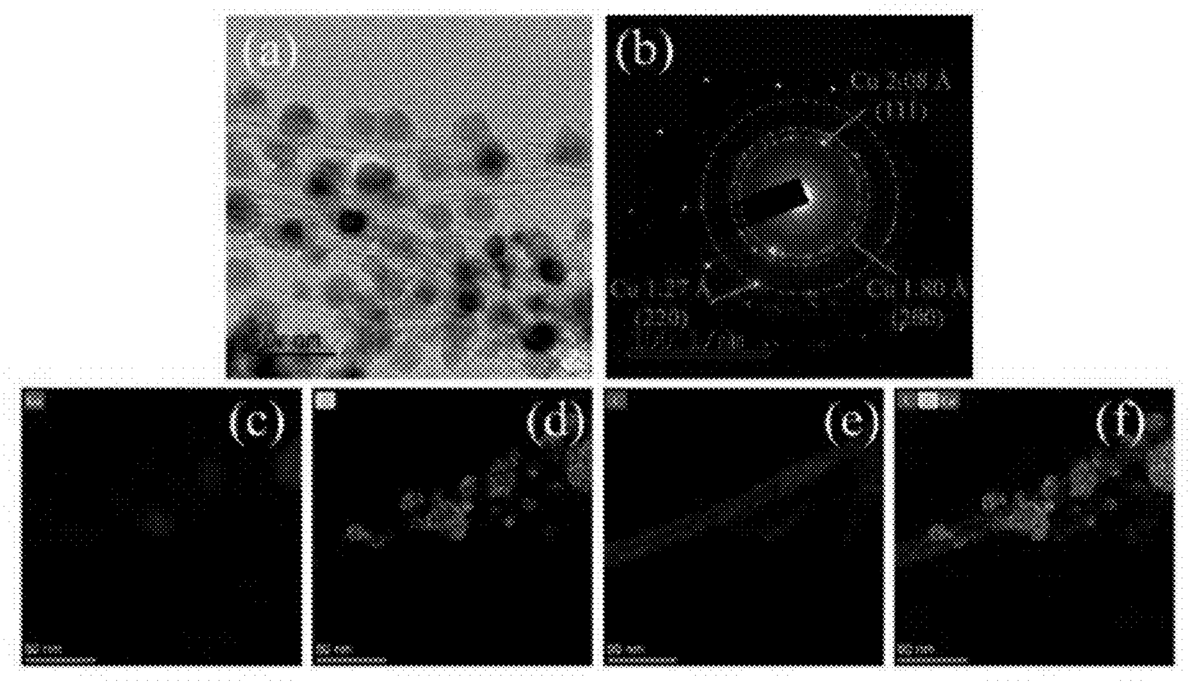
FIG. 12 illustrates analysis results of FE-TEM, SAED, and EDS analysis results for a nickel-CNT nanocomposite prepared in Preparation Example 5 and recovered from the first reactor.

The copper-CNT nanocomposite prepared in Preparation Example 5 and recovered from the first reactor was analyzed using FE-TEM (Talos Fe200X G2 (Thermo Fisher Scientific, US)), SAED, and EDS, and the results are illustrated in FIG. 12.

FIG. 12 illustrates analysis results of FE-TEM, SAED, and EDS for the nickel-CNT nanocomposite prepared in Preparation Example 5 and recovered from the first reactor.

Referring to FIG. 12, it can be confirmed that particles are deposited on the surface of the CNT in the FE-TEM image (a), and the SAED pattern (b) shows data identical to that obtained by XRD diffraction analysis. Additionally, examining the TEM-EDS mapping analyses (c) to (f), it can be confirmed that the particles deposited on the surface of the CNT are Cu, and a thin oxide film enveloping the particles has been formed.

Experimental Example 5

Evaluation Method for Electrochemical Property

Figure 13:
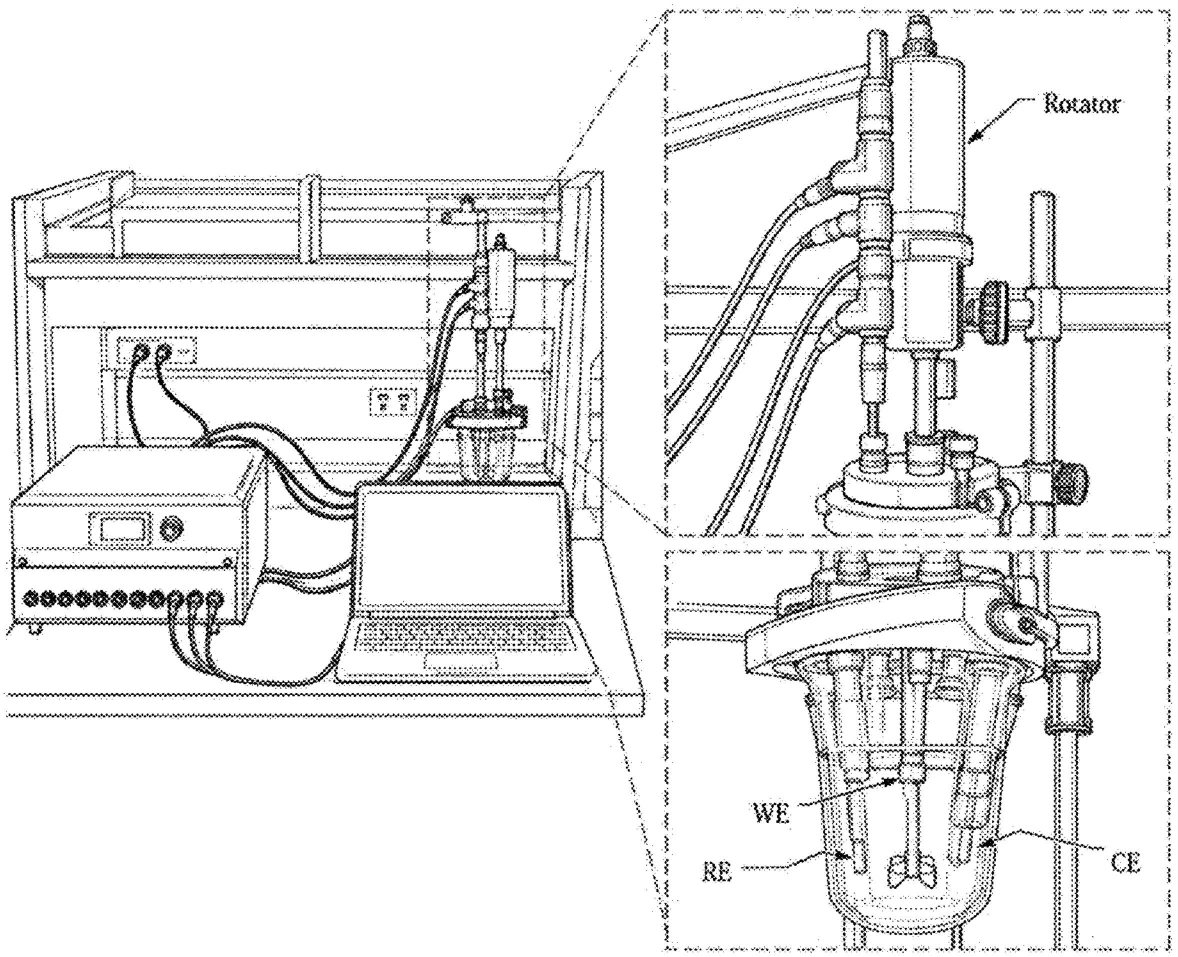
FIG. 13 is an image illustrating a three-electrode Potentiostat/Galvanostat (PGSTAT128N, Metrohm, Switzerland).

The electrochemical properties of the water-electrolysis catalyst prepared in Examples 1 to 4 were measured using a Potentiostat/Galvanostat (PGSTAT128N, Metrohm, Switzerland) configured with a three-electrode system, and the utilized equipment is illustrated in FIG. 13.

A glassy carbon electrode with a diameter of 3 mm was used as a working electrode, a platinum sheet was used as a counter electrode, and a double junction Ag/AgCl/3M KCl was used as a reference electrode.

In the present disclosure, all potentials were calculated based on the Reversible Hydrogen Electrode (RHE) using the following Equation 1:

$$ERHE = E\text{Ag/AgCl} + 0.1976\text{ V} + (0.059 \times \text{pH}) \quad \text{[Equation 1]}$$

In the present disclosure, all electrochemical electrolytes used were 1 M KOH (pH 14), and all solutions used a rotator spinning the working electrode at 1,600 rpm was employed to remove bubbles generated at the working electrode.

The Oxygen Evolution Reaction (OER) was measured using Linear Sweep Voltammetry (LSV) in the range of 0.5 to 2 V vs. RHE at a scan rate of 10 mV/s.

To determine the Electrochemical Active Surface Area (ECSA), the double layer capacitance (Cdl) was measured while changing the scan rate from 20 to 120 mV/s within the non-Faradic potential range of 1.1 to 1.4 V vs. RHE, using Cyclic Voltammetry (CV) graphs.

The Hydrogen Evolution Reaction (HER) was measured using Linear Sweep Voltammetry (LSV) in the range of 0 to −1 V vs. RHE at a scan rate of 10 mV/s.

To determine the Electrochemical Active Surface Area (ECSA), the double layer capacitance (Cdl) was measured by changing the scan rate from 20 to 120 mV/s within the non-Faradic potential range of 0.4 to 0.6 V vs. RHE, using Cyclic Voltammetry (CV) graphs.

Result and Analysis

1. Oxygen Evolution Reaction 1-1. Analysis of Oxygen Evolution Reactivity

Figure 14A:
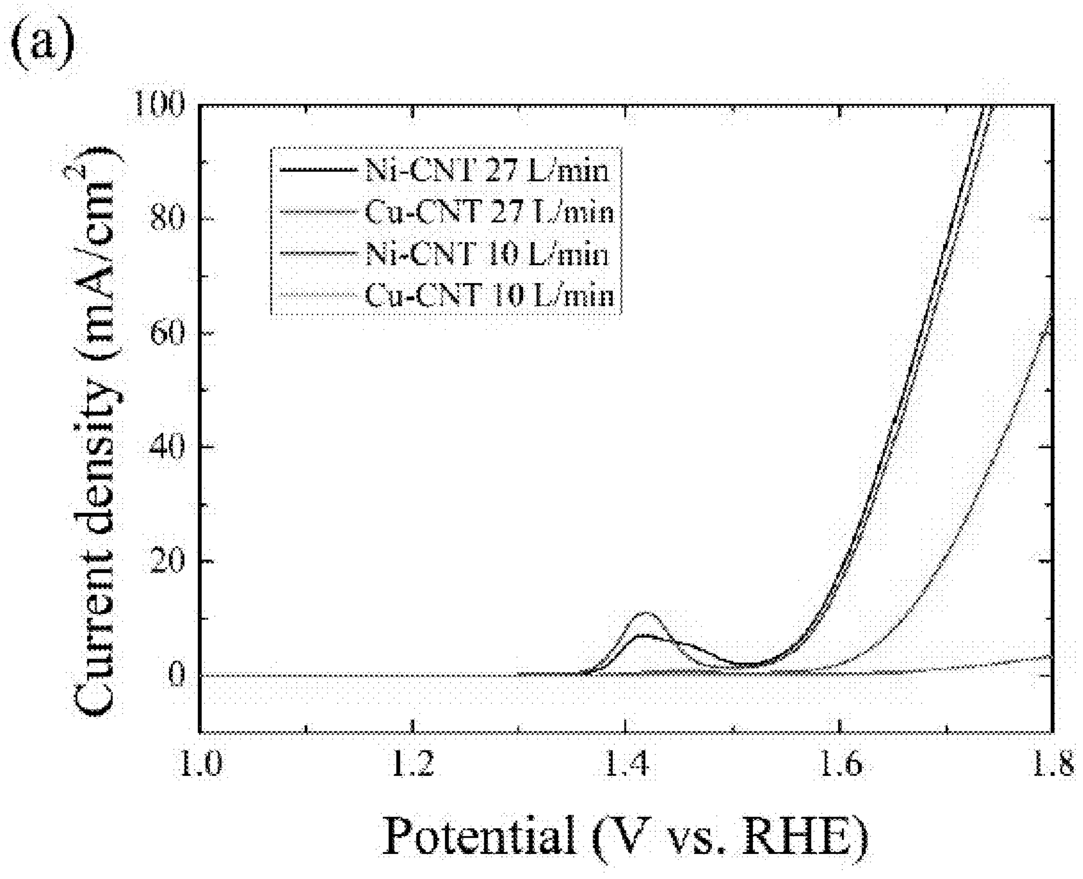
FIG. 14A is a graph illustrating Linear Sweep Voltammetry (LSV) for OER.
Figure 14B:
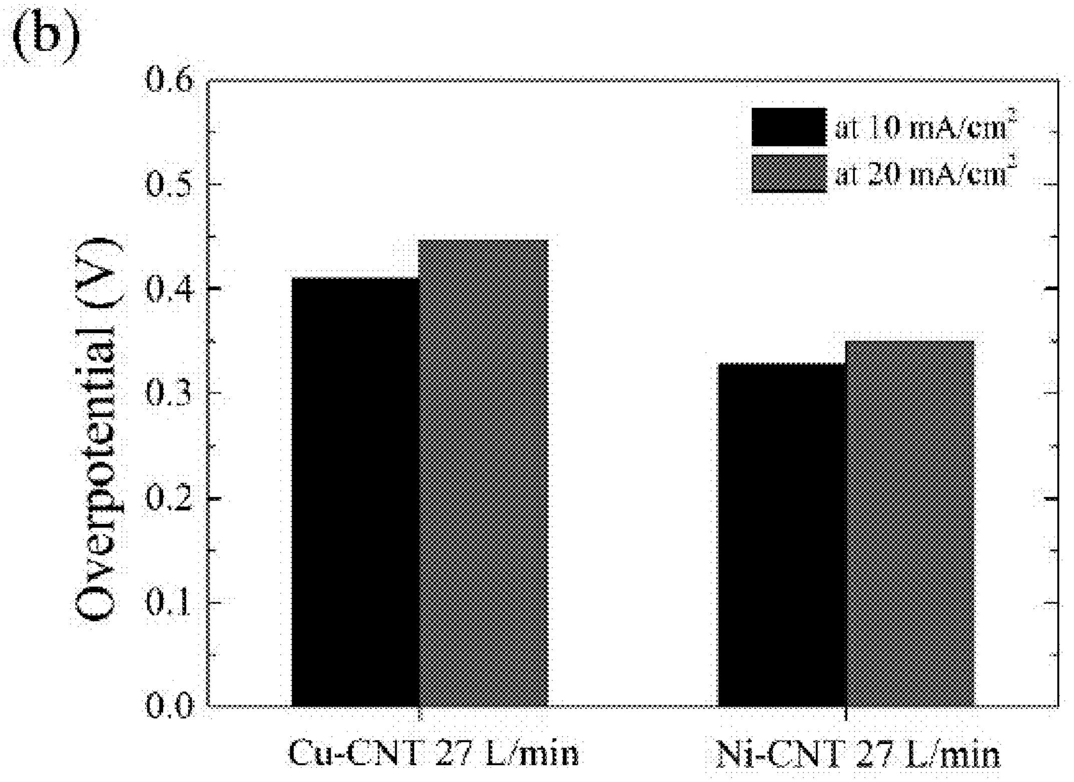
FIG. 14B is a graph illustrating overpotential measurements according to LSV results.
Figure 14C:
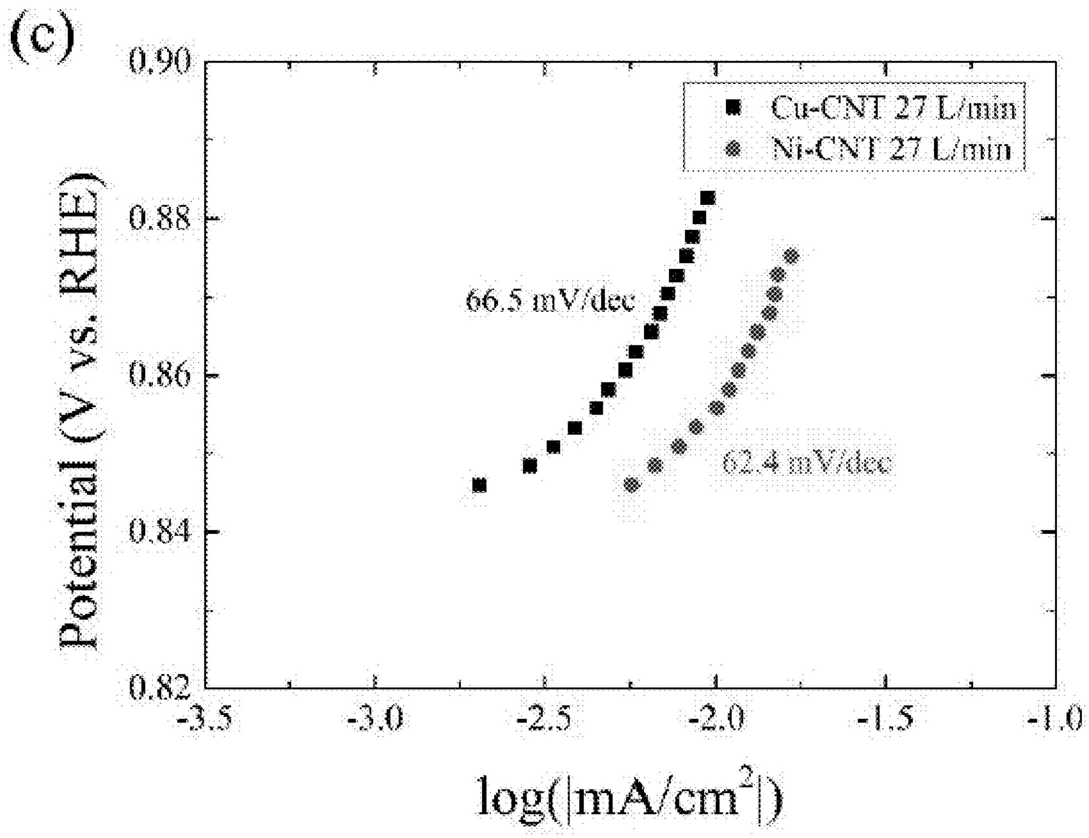
FIG. 14C is a graph illustrating Tafel slopes.

FIG. 14A is a graph illustrating Linear Sweep Voltammetry (LSV) for OER, FIG. 14B is a graph illustrating overpotential measurements according to LSV results, and FIG. 14C is a graph illustrating Tafel slopes.

From FIG. 14A, it can be seen that the cases including the Ni-CNT nanocomposite (Examples 1 and 2) exhibit a more rapid increase in current with voltage increase compared to the cases including the Cu-CNT nanocomposite (Examples 3 and 4).

Furthermore, the higher current densities are shown in the cases in which the flow rate of argon is 27 L/min (Examples 2 and 4) compared to in the cases in which the flow rate of argon is 10 L/min (Examples 1 and 3). This is because the general spherical nanoparticles are formed at a lower flow rate of argon and the metal is deposited on the surface of the CNT at a higher flow rate of argon.

From FIG. 14B, it can be seen that the overpotential values are lower for the cases including the Ni-CNT nanocomposite (Examples 1 and 2) compared to those including the Cu-CNT nanocomposite (Examples 3 and 4).

Specifically, at 10 $mA/cm^2$ and 20 $mA/cm^2$, Example 2 shows overpotentials of 0.328 V and 0.350 V, respectively, which are lower than those of Example 4.

From FIG. 14C, it can be seen that the Tafel slope of Example 2 (Ni-CNT) is 62.4 mV/dec, which is lower than 66.5 mV/dec of Example 4 (Cu-CNT).

From these results, it can be concluded that the oxygen evolution reaction performs better in the case of Example 2, where argon gas is injected at the flow rate of 27 L/min and the Ni-CNT nanocomposite is included.

1-2. Electrochemical Active Surface Area (ECSA) Analysis

Figure 15A:
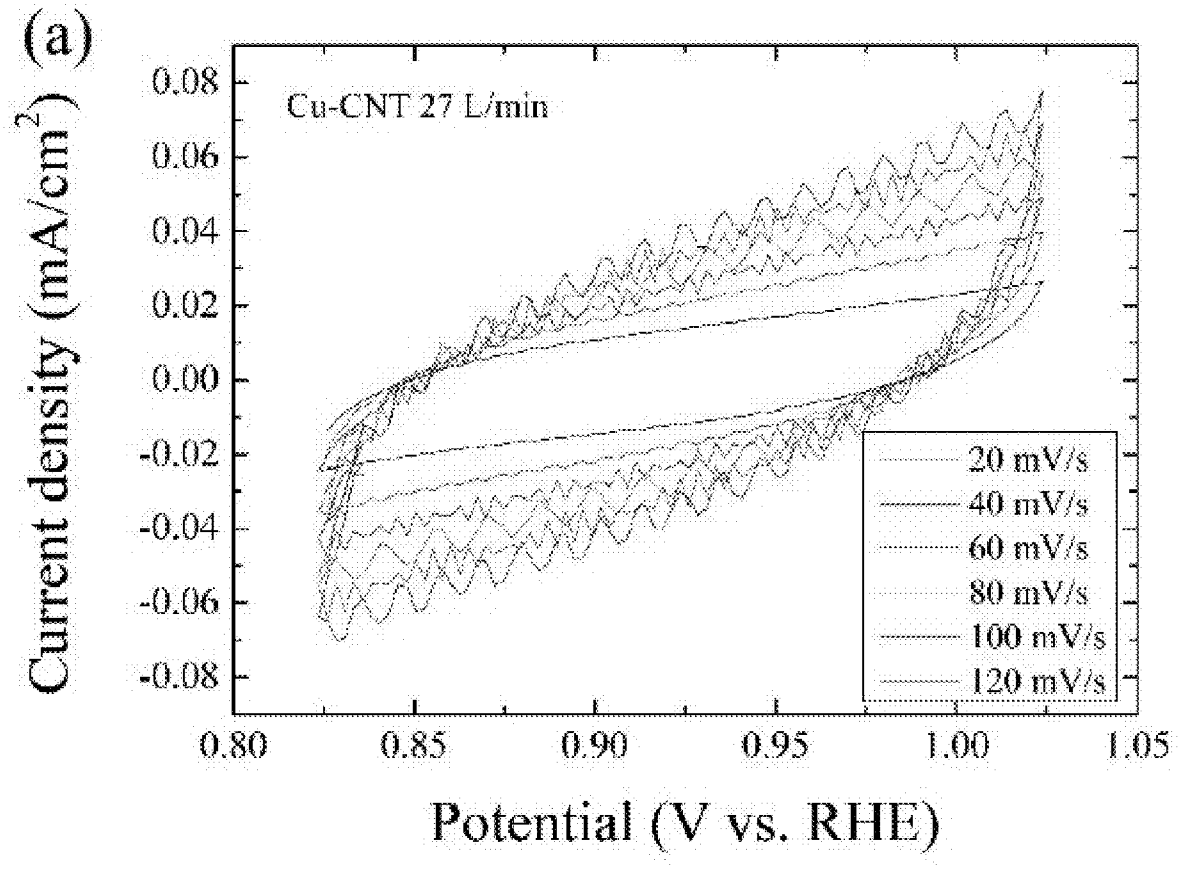
FIG. 15A is a graph illustrating results of measuring Cyclic Voltammetry (CV) according to scan rates of Example 4 (Cu-CNT) in OER.
Figure 15B:
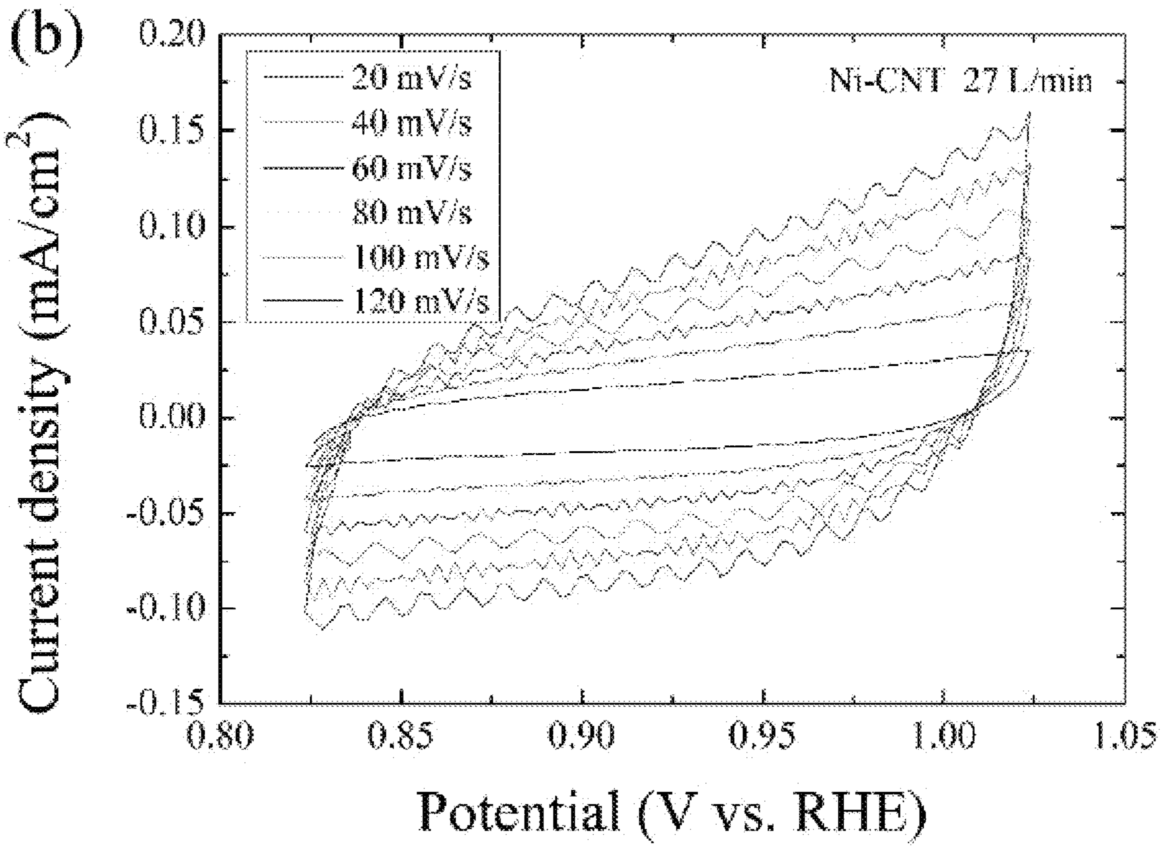
FIG. 15B is a graph illustrating results of measuring Cyclic Voltammetry (CV) according to scan rates of Example 2 (Ni-CNT) in OER.
Figure 15C:
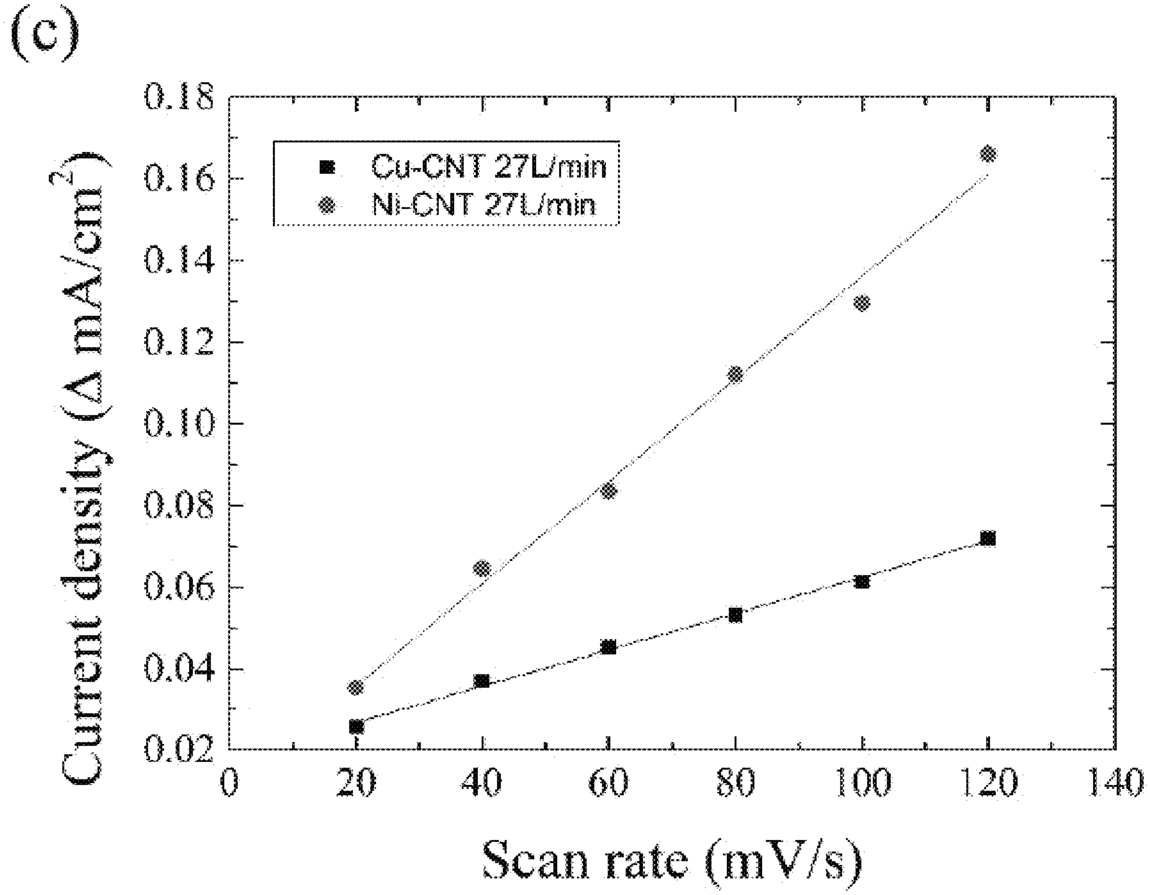
FIG. 15C is a graph illustrating a change in current density differences depending on the scan rate by measuring the current density differences between the highest and lowest points at the center voltage location in the CV measurement data graphs for OER.

FIG. 15A is a graph illustrating results of measuring Cyclic Voltammetry (CV) according to scan rates of Example 4 (Cu-CNT) in OER, FIG. 15B is a graph illustrating results of measuring Cyclic Voltammetry (CV) according to scan rates of Example 2 (Ni-CNT) in OER, and FIG. 15C is a graph illustrating a change in current density differences depending on the scan rate by measuring the current density differences between the highest and lowest points at the center voltage location in the CV measurement data graphs for OER.

The slopes of FIG. 15C, which are the double layer capacitance (Cdl) value proportional to ECSA, indicate that a larger slope corresponds to an increased active surface area of the catalyst. From FIGS. 15A to 15C, it can be seen that Example 2 (Ni-CNT) exhibits a higher surface activity compared to Example 4 (Cu-CNT).

From these results, it can be concluded that in the case of Example 2, where argon gas is injected at the flow rate of 27 L/min and the Ni-CNT nanocomposite is included, the oxygen evolution reaction is superior.

2. Hydrogen Evolution Reaction 2-1. Analysis of Hydrogen Evolution Reactivity

Figure 16A:
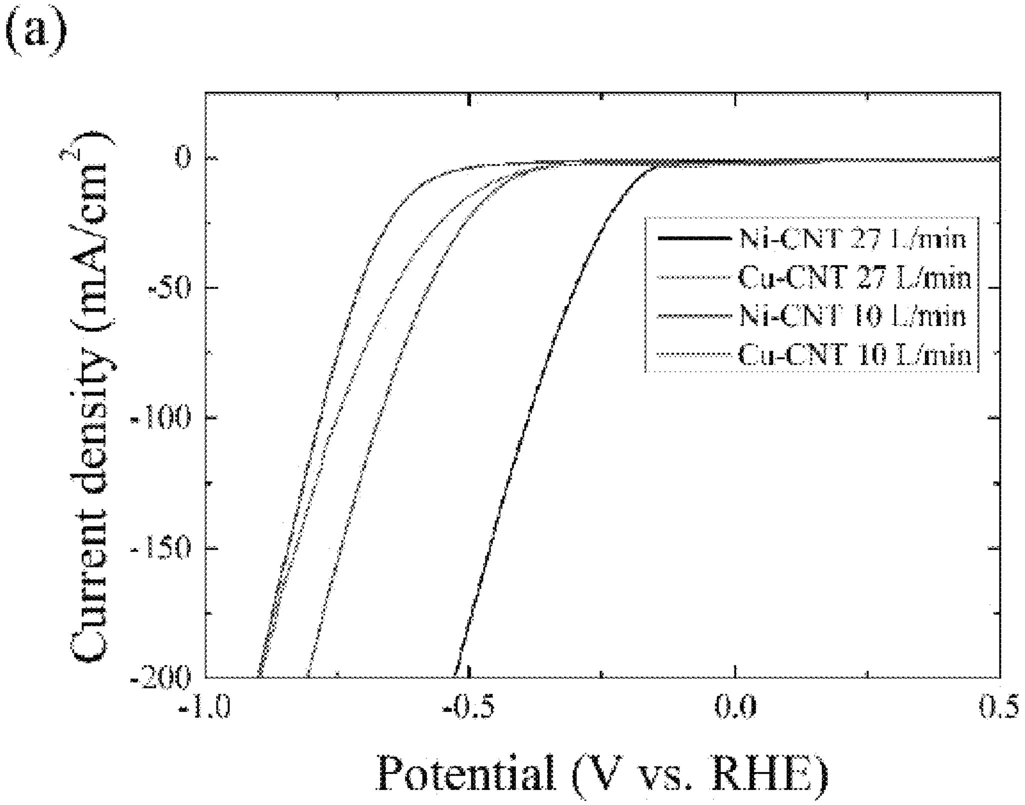
FIG. 16A is a graph illustrating Linear Sweep Voltammetry (LSV) for HER.
Figure 16B:
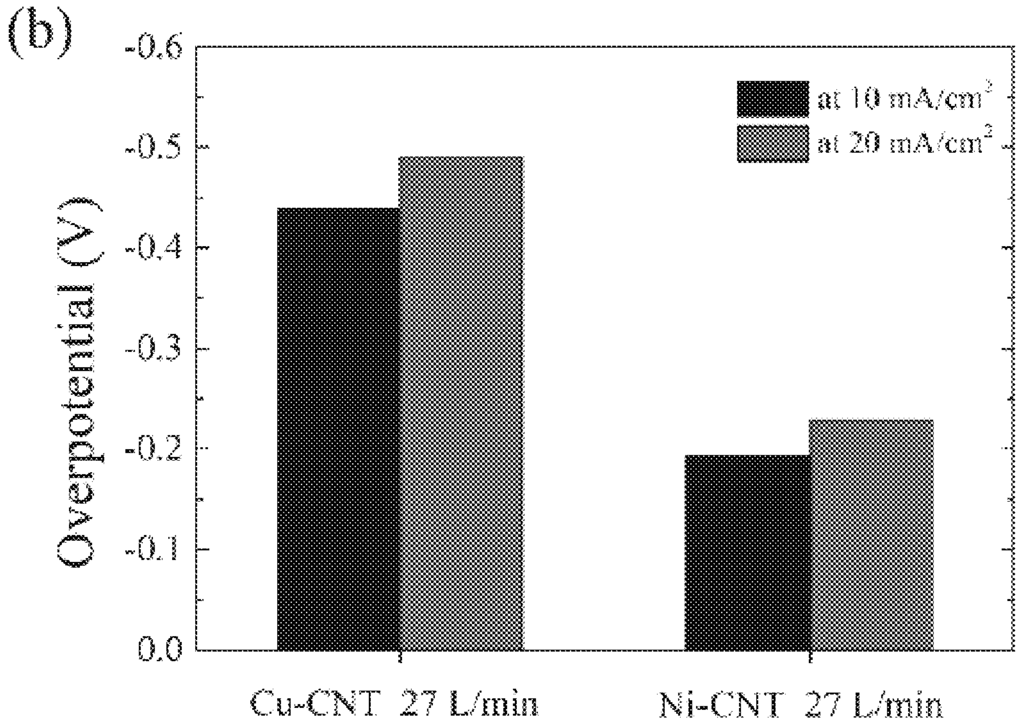
FIG. 16B is a graph illustrating overpotential measurements based on LSV results.
Figure 16C:
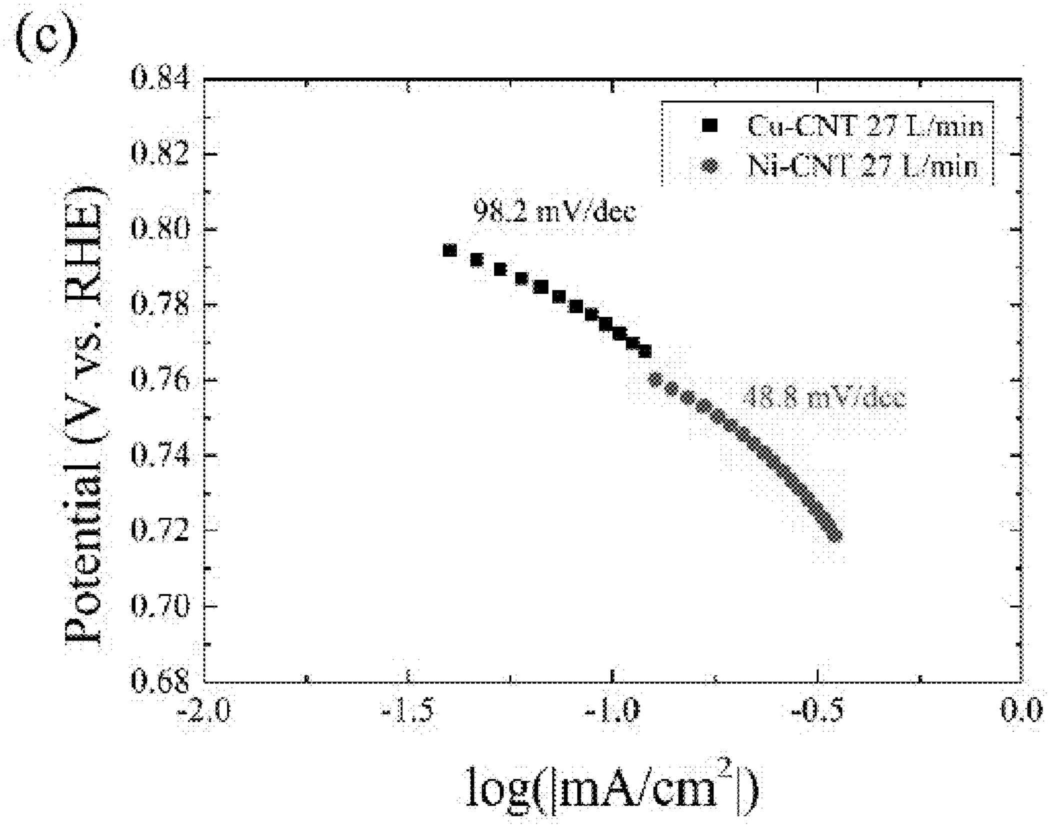
FIG. 16C is a graph illustrating Tafel slopes.

FIG. 16A is a graph illustrating Linear Sweep Voltammetry (LSV) for HER, FIG. 16B is a graph illustrating overpotential measurements based on LSV results, and FIG. 16*c* is a graph illustrating Tafel slopes.

From FIG. 16A, it can be seen that the cases including the Ni-CNT nanocomposite (Examples 1 and 2) exhibit a more rapid increase in current with voltage increase compared to the cases including the Cu-CNT nanocomposite (Examples 3 and 4).

Furthermore, the higher current densities are shown in the cases in which the flow rate of argon is 27 L/min (Examples 2 and 4) compared to in the case in which a flow rate of argon is 10 L/min (Examples 1 and 3).

From FIG. 16B, it can be seen that the overpotential values are lower for the cases including the Ni-CNT nanocomposite (Examples 1 and 2) compared to those including the Cu-CNT nanocomposite (Examples 3 and 4).

Specifically, at 10 $mA/cm^2$ and 20 $mA/cm^2$, Example 2 (Ni-CNT) shows overpotentials of −0.192 V and −0.228 V, respectively, while Example 4 (Cu-CNT) is measured as −0.439 V at 10 $mA/cm^2$ and −0.490 V at 20 $mA/cm^2$.

From FIG. 16C, it can be seen that the Tafel slope of Example 2 (Ni-CNT) is 48.8 mV/dec, which is lower than 98.2 mV/dec of Example 4 (Cu-CNT).

From these results, it can be concluded that the hydrogen evolution reaction performs better in the case of Example 2, where argon gas is injected at the flow rate of 27 L/min and the Ni-CNT nanocomposite is included.

2-2. Electrochemical Active Surface Area (ECSA) Analysis

Figure 17A:
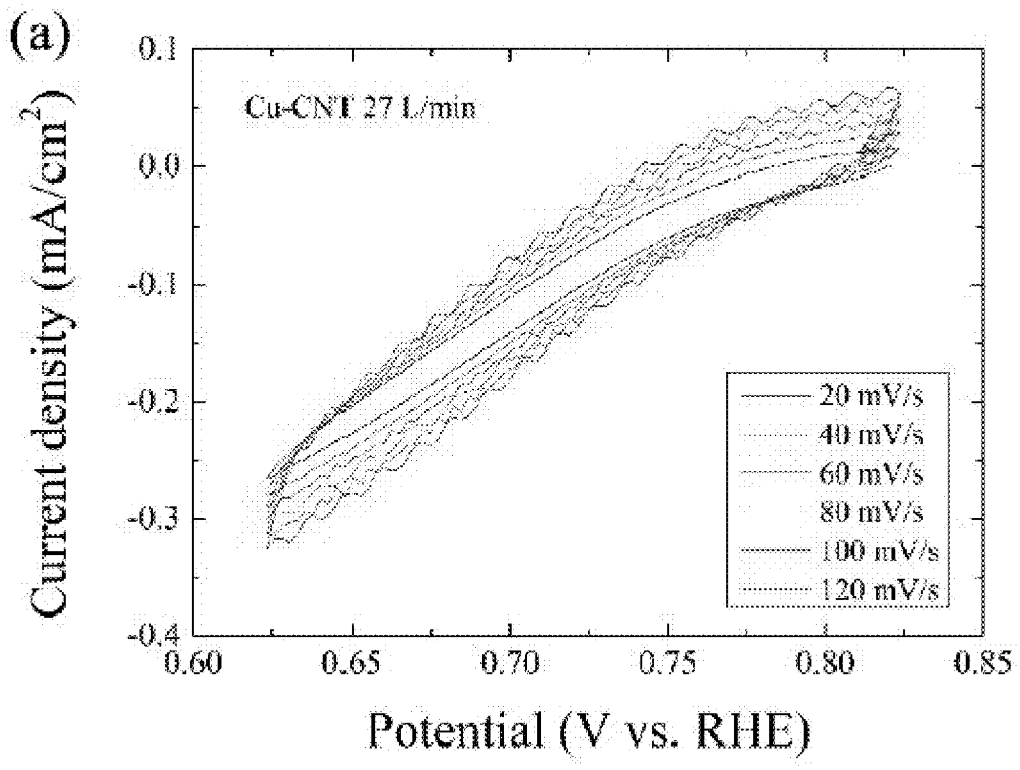
FIG. 17A is a graph illustrating results of measuring Cyclic Voltammetry (CV) according to scan rates of Example 4 (Cu-CNT) in HER.
Figure 17B:
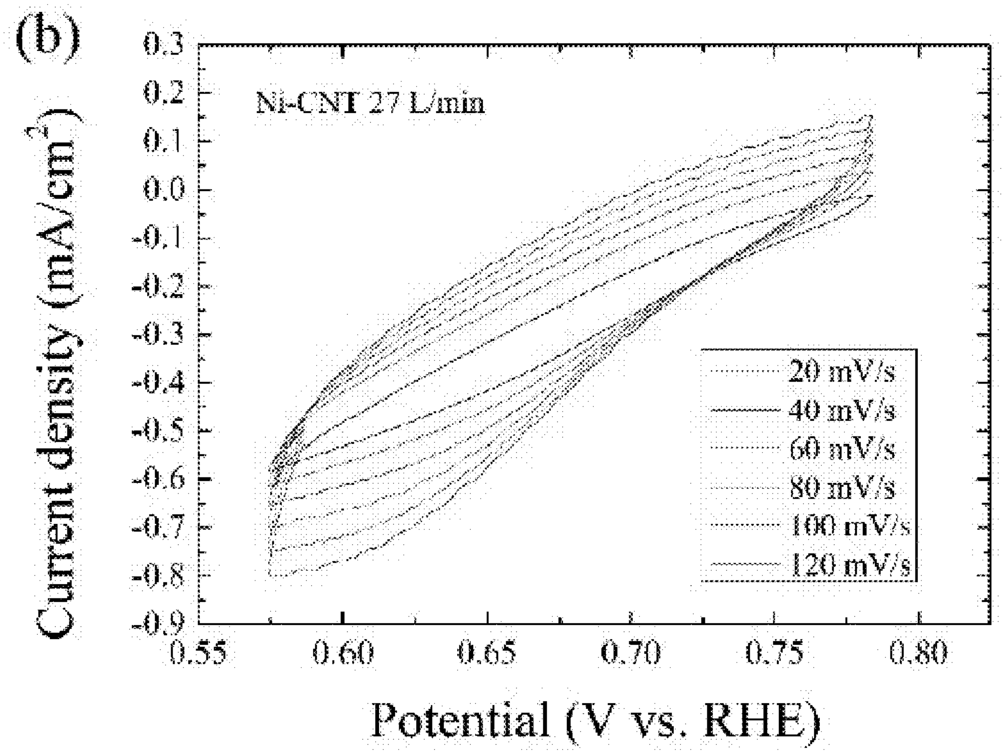
FIG. 17B is a graph illustrating results of measuring Cyclic Voltammetry (CV) according to scan rates of Example 2 (Ni-CNT) in HER.
Figure 17C:
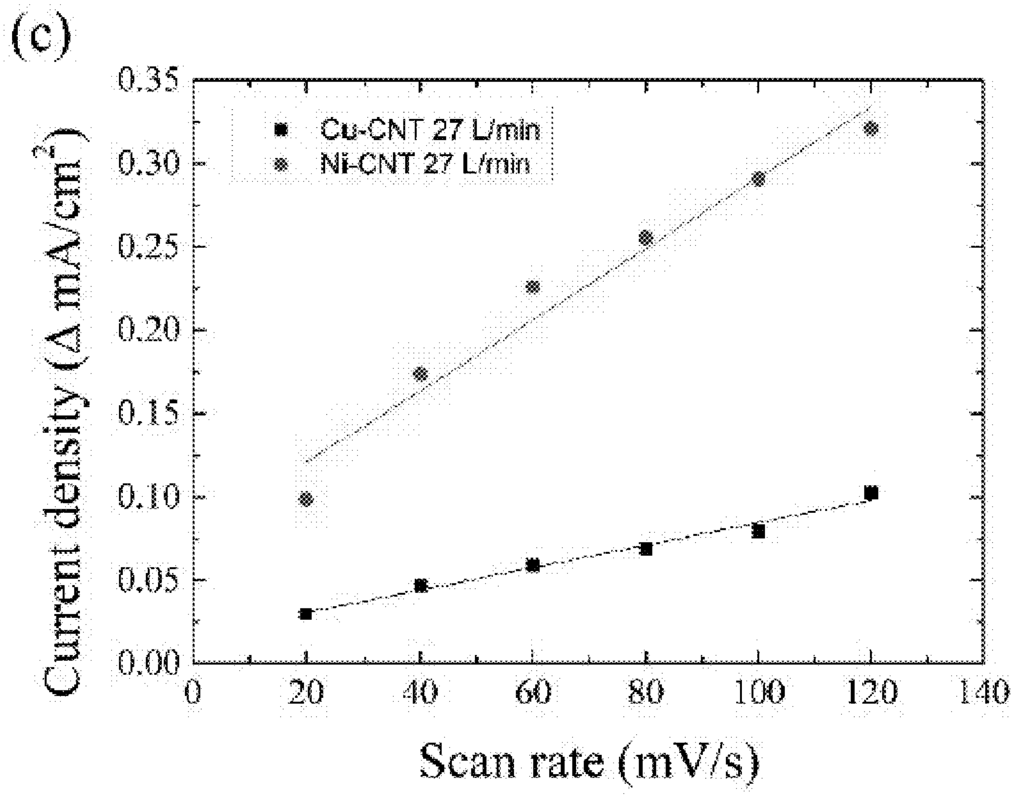
FIG. 17C is a graph illustrating a change in current density differences depending on the scan rate by measuring the current density differences between the highest and lowest points at the center voltage location in the CV measurement data graphs for HER.

FIG. 17A is a graph illustrating results of measuring Cyclic Voltammetry (CV) according to scan rates of Example 4 (Cu-CNT) in HER, FIG. 17B is a graph illustrating results of measuring Cyclic Voltammetry (CV) according to scan rates of Example 2 (Ni-CNT) in HER, and FIG. 17C is a graph illustrating current density differences that changes according to scan rates through measuring current density differences between the highest and lowest points at a center voltage location in the CV measurement data graphs for HER.

The slopes of FIG. 17C, which are the double layer capacitance (Cdl) value proportional to ECSA, indicate that a larger slope corresponds to an increased active surface area of the catalyst. From FIGS. 17A to 17C, it can be seen that Example 2 (Ni-CNT) exhibits a higher surface activity compared to Example 4 (Cu-CNT).

From these results, it can be concluded that in the case of Example 2, where argon gas is injected at the flow rate of 27 L/min and the Ni-CNT nanocomposite is included, the hydrogen evolution reaction is superior.

Experimental Example 5: Comparison of Activity with Various Catalysts in Similar Electrolytes Table 3 below compares the OER and HER activities of the water-electrolysis catalysts including the metal-CNTs of the present disclosure with catalysts prepared by chemical reduction and electroless plating methods in the same electrolyte or at the same pH.

TABLE 3

| Material | Synthesis Method | Electrolyte | Tafel slope (mV/dec.) |
|---|---|---|---|
| Ni-CNT nanopomposite | Thermal Plasma | 1M KOH | OER: 62.4<br>HER: 48.8 |
| Cu-CNT nanopomposite | Thermal Plasma | 1M KOH | OER: 65.5<br>HER: 98.2 |
| Co2B-500 | Chemical Reduction | 0.1M KOH<br>1M KOH | OER: 45<br>HER: 136.2 |
| Co-Ni NP/NS | Chemical Reduction | 1M KOH | OER: 77<br>HER: 127 |

TABLE 3-continued

| Material | Synthesis Method | Electrolyte | Tafel slope (mV/dec.) |
|---|---|---|---|
| 3D NNCNTAs | Chemical Reduction | 1M KOH | OER: 65 |
| Amorphous transition metal boride | Chemical Reduction | 1M KOH | OER: 84 |
| CoB/NF | Electroless Plating | 1M KOH | OER: 80HER: 96 |
| β-$Mo_2C$ NP | Chemical Reduction | 1M KOH | HER: 60 |
| β-$Mo_2C$ NR | Chemical Reduction | 1M KOH | HER: 66.2 |
| β-$Mo_2C$ NB | Chemical Reduction | 1M KOH | HER: 49.7 |
| $CoFe_2O_4$-Li NP | Chemical Reduction | 1M KOH | OER: 42.1 |

* NP: nanoparticle, NS: nanosheet, NR: nanorod, NB: nanobelt, 3D NNCNTAs: three-dimensional Ni@[$Ni(^{2+3+})Co_2(OH)_{6-7}$]x nanotube arrays, NF: nickel foam While most conventional catalysts are synthesized by chemical reduction requiring multi-step processes and long production times, the process using thermal plasma of the present disclosure has the advantage of eliminating unnecessary steps such as filtration and drying.

In particular, it can be observed that the Ni-CNT nanocomposite of the present disclosure exhibit superior OER and HER activities compared to cobalt-based catalysts such as $Co_2B$-500, Co—Ni NP/NS, and CoB/NF.

As set forth above, the present disclosure can prepare a metal-CNT nanocomposite capable of utilizing as a water-electrolysis catalyst or electrode material for lithium-ion batteries by using thermal plasma, and manufacture a water-electrolysis catalyst electrode including this nanocomposite. By doing so, without employing wet chemistry methods, the present disclosure can exhibit excellent Oxygen Evolution Reaction (OER) and Hydrogen Evolution Reaction (HER) at the anode or cathode due to superior overpotentials, current densities, and surface areas.

Although the present disclosure has been described in detail through example embodiments above, the scope of rights of the present disclosure is not limited to thereto. It is intended that numerous modifications and improvements that can be attempted by those skilled in the art based on the fundamental concepts of the present disclosure as defined in the appended claims are also included within the scope of the present disclosure.

DESCRIPTION OF SYMBOLS

100: Reaction Chamber,
110: First Reactor
120: Second Reactor,
130: Third Reactor
200: Torch Unit,
300: Metal Supply Unit
400: CNT Supply Unit,
500: Power Supply Unit
600: Gas Supply Unit

INDUSTRIAL APPLICABILITY

A method for preparing a metal-CNT nanocomposite according to the present disclosure can prepare a metal-CNT nanocomposite capable of utilizing as a water-electrolysis catalyst or electrode material for lithium-ion batteries by using thermal plasma, and manufacture a water-electrolysis catalyst electrode including this nanocomposite. By doing so, without employing wet chemistry methods, the present disclosure can exhibit excellent Oxygen Evolution Reaction (OER) and Hydrogen Evolution Reaction (HER) at the anode or cathode due to superior overpotentials, current densities, and surface areas.

The invention claimed is:

1. A method for manufacturing a water-electrolysis catalyst electrode including a metal-CNT nanocomposite, comprising:

preparing the metal-CNT nanocomposite; and
coating the water-electrolysis catalyst electrode with the metal-CNT nanocomposite,
wherein the preparing the metal-CNT nanocomposite comprises:
generating a plasma jet by injecting plasma forming gas into a triple torch-type plasma jet device and applying input power;
depositing vaporized metal on CNT by feeding the metal and the CNT to the plasma jet respectively, using carrier gas; and
recovering the metal-CNT nanocomposite by cooling the CNT on which the vaporized metal has been deposited,
wherein the coating the water-electrolysis catalyst electrode with the metal-CNT nanocomposite comprises:
manufacturing a catalyst ink that includes the metal-CNT nanocomposite; and
coating the electrode with the catalyst ink,
wherein the manufacturing the catalyst ink comprises:
preparing a mixture by combining the metal-CNT nanocomposite, propanol, deionized water, and perfluorosulfonic acid polymer; and
ultrasonically treating the mixture for 50 to 70 minutes.

2. The method for manufacturing the water-electrolysis catalyst electrode including the metal-CNT nanocomposite of claim 1, wherein an amount of the metal-CNT nanocomposite coated on the electrode is 1 to 1.5 mg per $cm^2$ of a surface of the electrode.

3. A water-electrolysis catalyst electrode including a metal-CNT nanocomposite that is prepared by the method of claim 1.

* * * * *